(12) United States Patent
Pillarisetty et al.

(10) Patent No.: US 10,804,399 B2
(45) Date of Patent: Oct. 13, 2020

(54) DOUBLE-SIDED QUANTUM DOT DEVICES

(71) Applicant: Intel Corporation, Santa Clara, CA (US)

(72) Inventors: Ravi Pillarisetty, Portland, OR (US); Jeanette M. Roberts, North Plains, OR (US); Nicole K. Thomas, Portland, OR (US); Hubert C. George, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/323,682

(22) PCT Filed: Sep. 24, 2016

(86) PCT No.: PCT/US2016/053608
§ 371 (c)(1),
(2) Date: Feb. 6, 2019

(87) PCT Pub. No.: WO2018/057017
PCT Pub. Date: Mar. 29, 2018

(65) Prior Publication Data
US 2019/0206993 A1    Jul. 4, 2019

(51) Int. Cl.
*H01L 21/44* (2006.01)
*H01L 29/06* (2006.01)
(Continued)

(52) U.S. Cl.
CPC ...... *H01L 29/785* (2013.01); *H01L 29/66439* (2013.01); *H01L 29/66977* (2013.01); *H01L 29/7782* (2013.01)

(58) Field of Classification Search
CPC .................. H01L 29/66977; H01L 29/66439
(Continued)

(56) References Cited

U.S. PATENT DOCUMENTS

| 5,663,571 A | 9/1997 | Ugajin |
| 6,333,516 B1 | 12/2001 | Katoh et al. |

(Continued)

FOREIGN PATENT DOCUMENTS

| WO | 2017155531 A1 | 9/2017 |
| WO | 2017213638 A1 | 12/2017 |

(Continued)

OTHER PUBLICATIONS

PCT/US2016/053609 filed Sep. 24, 2016 Quantum Dot Array Devices With Shared Gates.
(Continued)

*Primary Examiner* — Calvin Lee
(74) *Attorney, Agent, or Firm* — Patent Capital Group

(57) ABSTRACT

Disclosed herein are quantum dot devices, as well as related computing devices and methods. For example, in some embodiments, a quantum dot device may include: a quantum well stack with first and second quantum well layers, a first set of gates disposed on the quantum well stack such that the first quantum well layer is disposed between the barrier layer and the first set of gates, a first set of conductive pathways extending from the first set of gates to a first face of the quantum dot device, a second set of gates disposed on the quantum well stack such that the second quantum well layer is disposed between the barrier layer and the second set of gates, and a second set of conductive pathways extending from the second set of gates to a second face of the quantum dot device, wherein the second face is different from the first face.

17 Claims, 31 Drawing Sheets

(51) Int. Cl.
    *H01L 29/78* (2006.01)
    *H01L 29/66* (2006.01)
    *H01L 29/778* (2006.01)

(58) Field of Classification Search
    USPC .............................................. 438/611; 257/14
    See application file for complete search history.

(56) References Cited

U.S. PATENT DOCUMENTS

| | | | |
|---|---|---|---|
| 6,597,010 B2* | 7/2003 | Eriksson | B82Y 10/00 257/14 |
| 7,830,695 B1 | 11/2010 | Moon | |
| 8,178,369 B2* | 5/2012 | Choi | B82Y 10/00 257/20 |
| 8,829,492 B2* | 9/2014 | Choi | B82Y 10/00 257/39 |
| 2001/0013628 A1 | 8/2001 | Tyagi et al. | |
| 2002/0179897 A1 | 12/2002 | Eriksson et al. | |
| 2003/0111659 A1 | 6/2003 | Tzalenchuk et al. | |
| 2004/0175881 A1 | 9/2004 | Forbes et al. | |
| 2005/0117617 A1 | 6/2005 | Yoshida et al. | |
| 2006/0011904 A1 | 1/2006 | Snyder et al. | |
| 2009/0173936 A1 | 7/2009 | Bunyk | |
| 2012/0074386 A1 | 3/2012 | Rachmady et al. | |
| 2012/0306011 A1 | 12/2012 | Lotfi et al. | |
| 2013/0087766 A1 | 4/2013 | Schenkel et al. | |
| 2013/0264617 A1 | 10/2013 | Joshi et al. | |
| 2014/0050242 A1 | 2/2014 | Taylor | |
| 2015/0187766 A1 | 7/2015 | Basker et al. | |
| 2019/0130298 A1 | 5/2019 | Pioro-Ladriere et al. | |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0165152 A1 | 5/2019 | Roberts et al. | |
| 2019/0181256 A1 | 6/2019 | Roberts et al. | |
| 2019/0206991 A1 | 7/2019 | Pillarisetty et al. | |
| 2019/0206992 A1 | 7/2019 | George et al. | |
| 2019/0229188 A1 | 7/2019 | Clarke et al. | |
| 2019/0229189 A1 | 7/2019 | Clarke et al. | |
| 2019/0252377 A1 | 8/2019 | Clarke et al. | |
| 2019/0259850 A1 | 8/2019 | Pillarisetty et al. | |
| 2019/0267692 A1 | 8/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0341459 A1 | 11/2019 | Pillarisetty et al. | |
| 2019/0363181 A1 | 11/2019 | Pillarisetty et al. | |
| 2019/0363239 A1 | 11/2019 | Yoscovits et al. | |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018031007 A1 | 2/2018 |
| WO | 2018031027 | 2/2018 |
| WO | 2018044267 A1 | 3/2018 |
| WO | 2018057013 A1 | 3/2018 |
| WO | 2018057015 A1 | 3/2018 |
| WO | 2018057017 A1 | 3/2018 |
| WO | 2018057018 A1 | 3/2018 |

OTHER PUBLICATIONS

U.S. Appl. No. 16/328,615, filed Feb. 26, 2019 Quantum Dot Array Devices With Shared Gates.
USPTO Notice of Allowance issued in U.S. Appl. No. 16/314,779, dated Nov. 18, 2019; 23 pages.
PCT International Search Report and Written Opinion issued in PCT/US2016/053608 dated May 31, 2017; 8 pages.
PCT International Search Report and Written Opinion issued in PCT/US2016/046674 dated May 12, 2017; 9 pages.
"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.

(56) References Cited

OTHER PUBLICATIONS

Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.

"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.
European Extended Search Report issued in EP Application No. 16916983.6 on May 13, 2020; 11 pages.

* cited by examiner

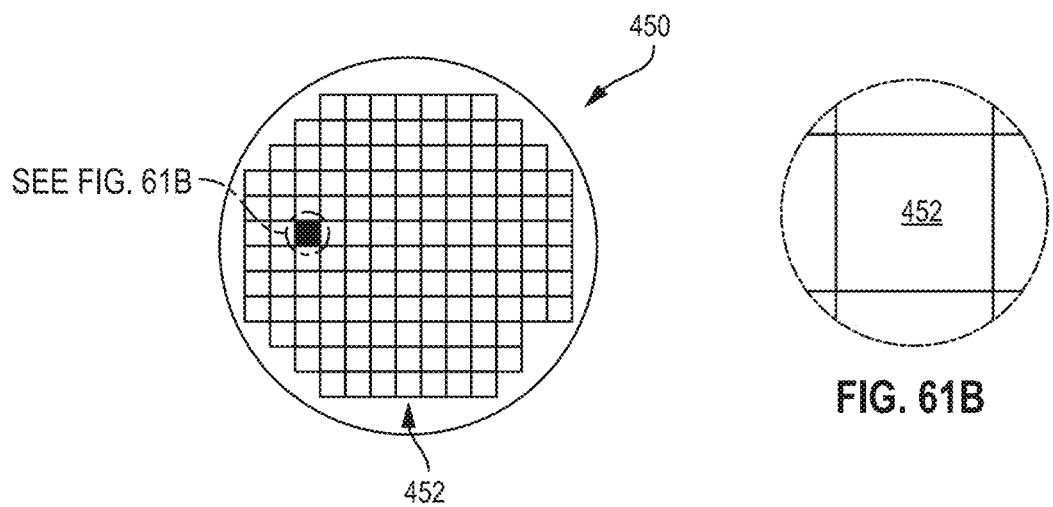
FIG. 61A
FIG. 61B
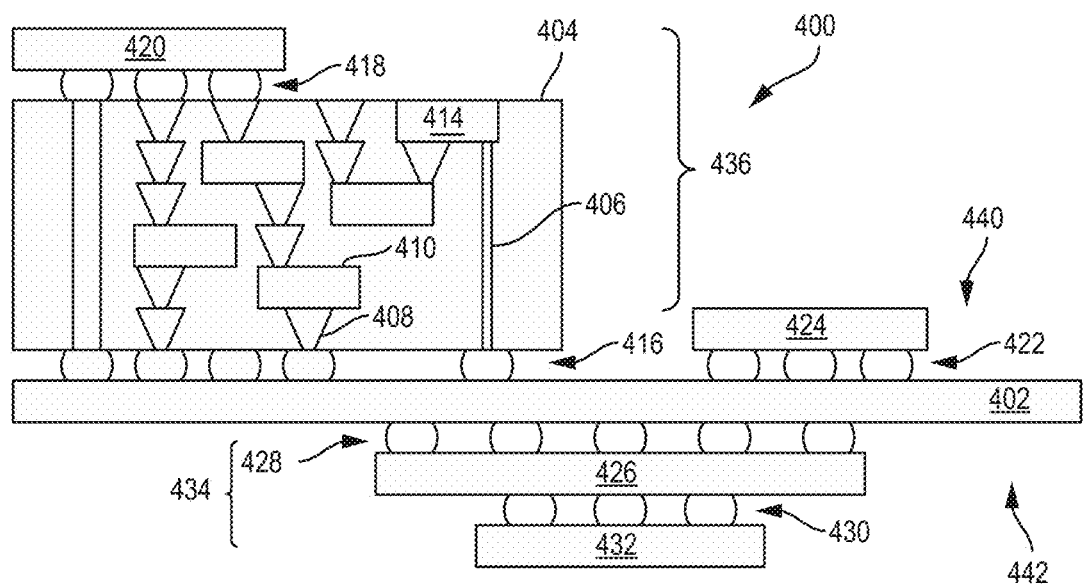
FIG. 62

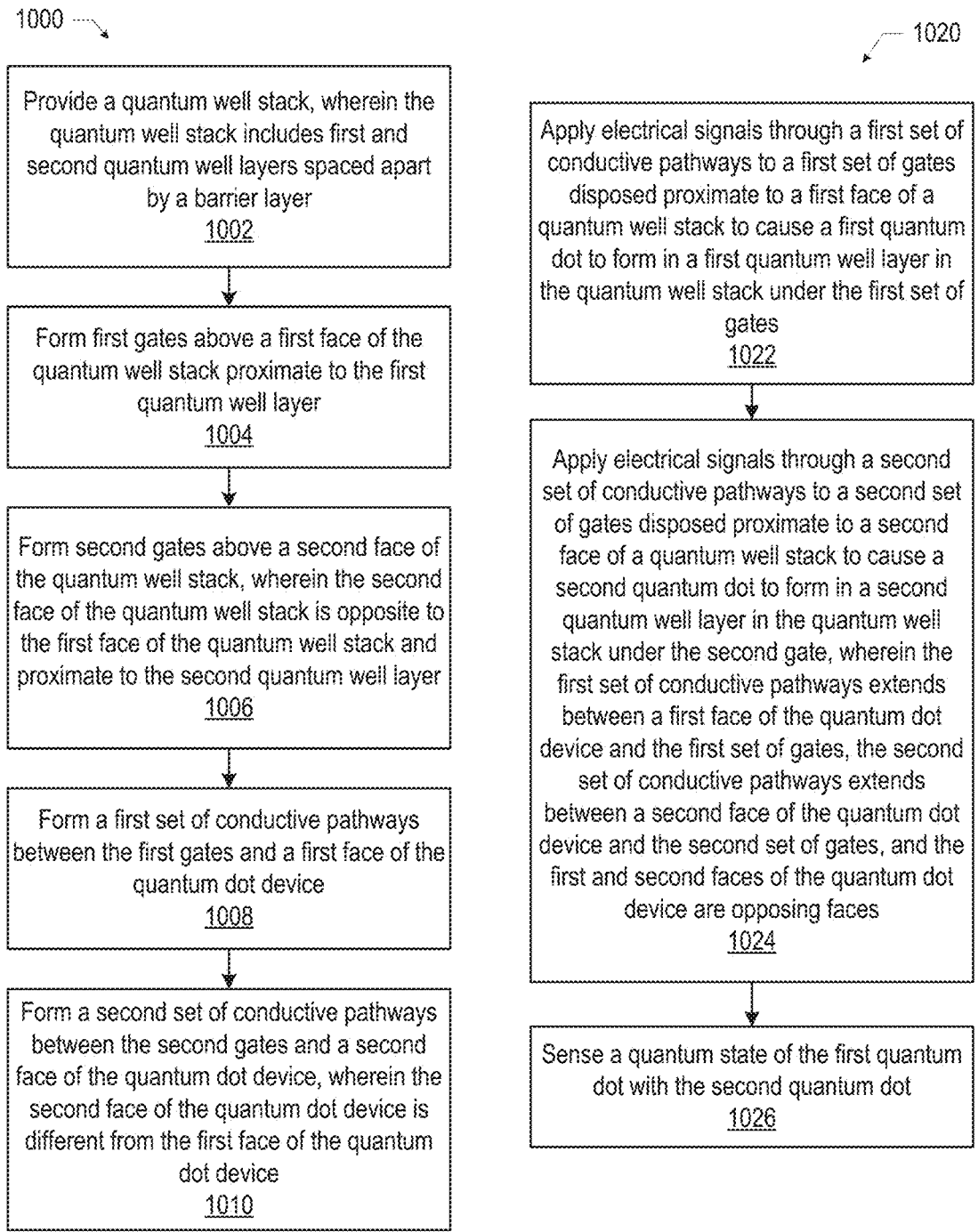

DOUBLE-SIDED QUANTUM DOT DEVICES

CROSS-REFERENCE TO RELATED APPLICATION

This application is a national phase entry of PCT International Application No. PCT/US2016/053608, filed Sep. 24, 2016, entitled "DOUBLE-SIDED QUANTUM DOT DEVICES." The disclosure of this prior application is incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 61A and 61B are top views of a wafer and dies that may include any of the quantum dot devices disclosed herein.

FIG. 62 is a cross-sectional side view of a device assembly that may include any of the quantum dot devices disclosed herein.

FIG. 63 is a flow diagram of an illustrative method of manufacturing a quantum dot device, in accordance with various embodiments.

FIG. 64 is a flow diagram of an illustrative method of operating a quantum dot device, in accordance with various embodiments.

DETAILED DESCRIPTION

Figure 1:
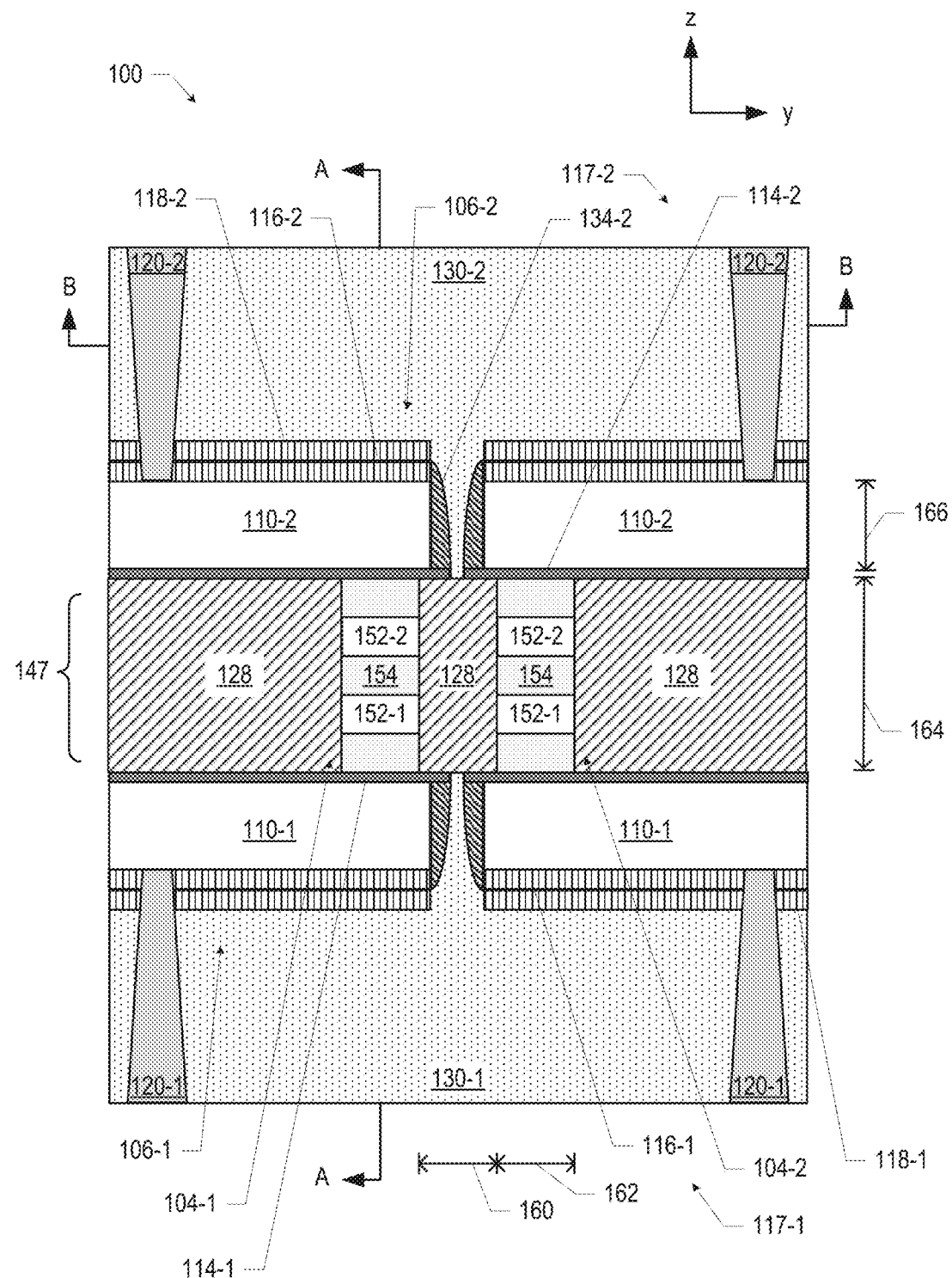
FIGS. 1-3 are cross-sectional views of a quantum dot device, in accordance with various embodiments.

Disclosed herein are quantum dot devices, as well as related computing devices and methods. For example, in some embodiments, a quantum dot device may include: a quantum well stack with first and second quantum well layers, a first set of gates disposed on the quantum well stack such that the first quantum well layer is disposed between the barrier layer and the first set of gates, a first set of conductive pathways extending from the first set of gates to a first face of the quantum dot device, a second set of gates disposed on the quantum well stack such that the second quantum well layer is disposed between the barrier layer and the second set of gates, and a second set of conductive pathways extending from the second set of gates to a second face of the quantum dot device, wherein the second face is different from the first face.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 2:
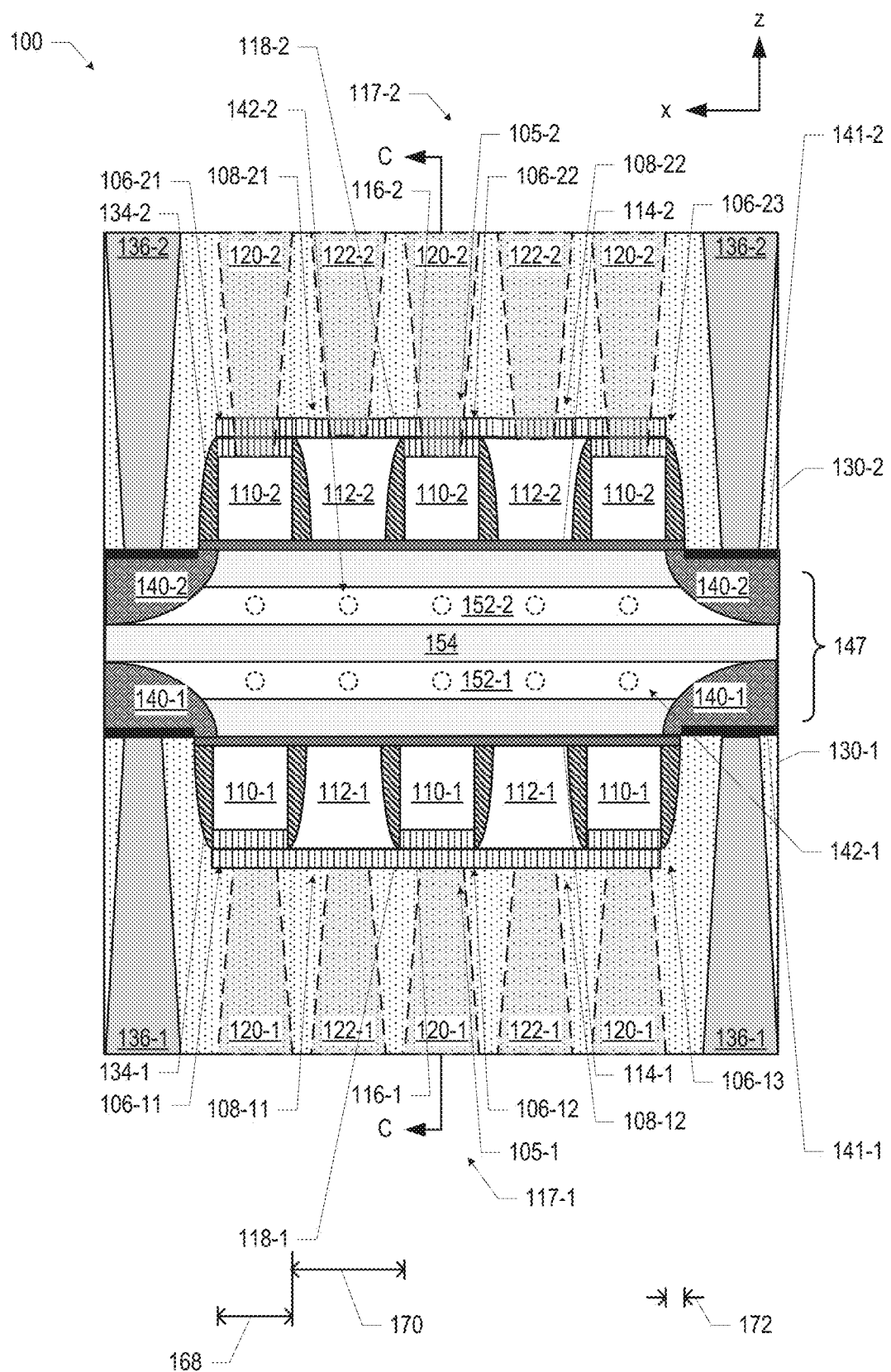
Figure 3:
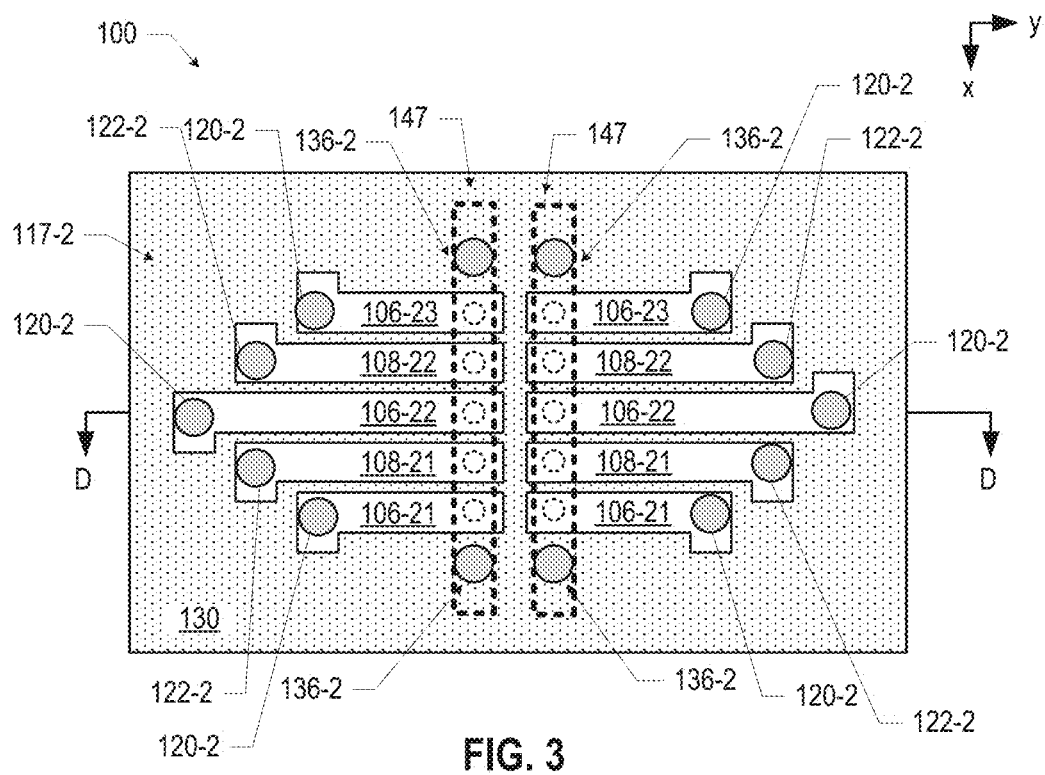

FIGS. 1-3 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 with a number of components not shown to more readily illustrate how the gates 106/108 may be patterned (while FIG. 1 illustrates a quantum dot device 100 taken along the section D-D of FIG. 3). Although FIG. 1 indicates that the cross section illustrated in FIG. 2 is taken through the fin 104-1, an analogous cross section taken through the fin 104-2 may be identical, and thus the discussion of FIG. 2 refers generally to the "fin 104."

The quantum dot device 100 may include multiple fins 104 spaced apart by insulating material 128. The fins 104 may include a quantum well stack 147, which may include a quantum well layer 152-1 and a quantum well layer 152-2 spaced apart by a barrier layer 154. The quantum well stack 147 may be formed as part of a material stack 146, examples of which are discussed in detail below with reference to FIGS. 50-51.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include two quantum well layers 152. The quantum well layers 152 included in the fins 104 may be arranged normal to the z-direction, and may provide layers in which a two-dimensional electron gas (2DEG) may form to enable the generation of a quantum dot during operation of the quantum dot device 100, as discussed in further detail below. The quantum well layers 152 themselves may provide a geometric constraint on the z-location of quantum dots in the fins 104, and the limited extent of the fins 104 (and therefore the quantum well layers 152) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 nanometers.

Multiple gates may be disposed on each of the fins 104. In particular, a first set of gates 105-1 may be disposed proximate to the "bottom" of each fin 104, and a second set of gates 105-2 may be disposed proximate to the "top" of each fin 104. In the embodiment illustrated in FIG. 2, the first set of gates 105-1 includes three gates 106-1 and two gates 108-1, and the second set of gates 105-2 includes three gates 106-2 and two gates 108-2. This particular number of gates is simply illustrative, and any suitable number of gates may be used. Additionally, as discussed below with reference to FIG. 52, multiple sets of the gates 105-1 and 105-2 may be disposed on the fin 104.

As shown in FIG. 2, the gate 108-11 may be disposed between the gates 106-11 and 106-12, and the gate 108-12 may be disposed between the gates 106-12 and 106-13. The gates 106-21, 108-21, 106-22, 108-22, and 106-23 (of the set of gates 105-2) are distributed along the fin 104 analogously to the distribution of the gates 106-11, 108-11, 106-12, 108-12, and 106-13 (of the set of gates 105-1). References to a "gate 106" herein may refer to any of the gates 106, while reference to a "gate 108" herein may refer to any of the gates 108. Reference to the "gates 106-1" herein may refer to any of the gates 106 of the first set of gates 105-1 (and analogously for the "gates 106-2") and reference to the "gates 108-1" herein may refer to any of the gates 108 of the first set of gates 105-1 (and analogously for the "gates 108-2").

Each of the gates 106/108 may include a gate dielectric 114 (e.g., the gate dielectric 114-1 for the gates 106-1/108-1, and the gate dielectric 114-2 for the gates 106-2/108-2). In the embodiment illustrated in FIG. 2, the gate dielectric 114 for all of the gates 106/108 in a particular set of gates 105 is provided by a common layer of gate dielectric material. In other embodiments, the gate dielectric 114 for each of the gates 106/108 in a particular set of gates 105 may be provided by separate portions of gate dielectric 114 (e.g., as discussed below with reference to FIGS. 55-58). In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. The gate dielectric 114-1 may be a same material as the gate dielectric 114-2, or a different material.

Each of the gates 106-1 may include a gate metal 110-1. The gate dielectric 114-1 may be disposed between the gate metal 110-1 and the quantum well stack 147. In some embodiments, the gate metal 110-1 may be a superconductor, such as aluminum, titanium nitride (e.g., deposited via atomic layer deposition), or niobium titanium nitride. The sides of the gate metal 110-1 may be substantially parallel, as shown in FIG. 2, and insulating spacers 134-1 may be disposed on the sides of the gate metal 110-1. As illustrated in FIG. 2, the spacers 134-1 may be thinner farther from the fin 104 and thicker closer to the fin 104. In some embodiments, the spacers 134-1 may have a convex shape. The spacers 134-1 may be formed of any suitable material, such as a carbon-doped oxide, silicon nitride, silicon oxide, or other carbides or nitrides (e.g., silicon carbide, silicon nitride doped with carbon, and silicon oxynitride).

Each of the gates 108-1 may include a gate metal 112-1. The gate dielectric 114-1 may be disposed between the gate metal 112-1 and the quantum well stack 147. In some embodiments, the gate metal 112-1 may be a different metal from the gate metal 110-1; in other embodiments, the gate metal 112-1 and the gate metal 110-1 may have the same material composition. In some embodiments, the gate metal 112-1 may be a superconductor, such as aluminum, titanium nitride (e.g., deposited via atomic layer deposition), or niobium titanium nitride.

Each of the gates 106-2 may include a gate metal 110-2 and a hardmask 116-2. The hardmask 116-2 may be formed of silicon nitride, silicon carbide, or another suitable material. The gate metal 110-2 may be disposed between the hardmask 116-2 and the gate dielectric 114-2, and the gate dielectric 114-2 may be disposed between the gate metal 110-2 and the fin 104. Only one portion of the hardmask 116-2 is labeled in FIG. 2 for ease of illustration. In some embodiments, the gate metal 110-2 may be a superconductor, such as aluminum, titanium nitride (e.g., deposited via atomic layer deposition), or niobium titanium nitride. In some embodiments, the hardmask 116-2 may not be present in the quantum dot device 100 (e.g., a hardmask like the hardmask 116-2 may be removed during processing, as discussed below). The sides of the gate metal 110-2 may be substantially parallel, as shown in FIG. 2, and insulating spacers 134-2 may be disposed on the sides of the gate metal 110-2 and the hardmask 116-2. As illustrated in FIG. 2, the spacers 134-2 may be thicker closer to the fin 104 and thinner farther away from the fin 104. In some embodiments, the spacers 134-2 may have a convex shape. The spacers 134-2 may be formed of any suitable material, such as a carbon-doped oxide, silicon nitride, silicon oxide, or other carbides or nitrides (e.g., silicon carbide, silicon nitride doped with carbon, and silicon oxynitride). In some embodiments, the gate metal 110-2 may be a different metal from the gate metal 110-1; in other embodiments, the gate metal 110-2 and the gate metal 110-1 may have the same material composition.

Each of the gates 108-2 may include a gate metal 112-2 and a hardmask 118-2. The hardmask 118-2 may be formed of any of the materials discussed above with reference to the hardmask 116-2. The gate metal 112-2 may be disposed between the hardmask 118-2 and the gate dielectric 114-2, and the gate dielectric 114-2 may be disposed between the gate metal 112-2 and the fin 104. In the embodiment illustrated in FIG. 2, the hardmask 118-2 may extend over the hardmask 116-2 (and over the gate metal 110-2 of the gates 106-2), while in other embodiments, the hardmask 118-2 may not extend over the gate metal 110-2. In some embodiments, the gate metal 112-2 may be a different metal from the gate metal 110-2; in other embodiments, the gate metal 112-2 and the gate metal 110-2 may have the same material composition. In some embodiments, the gate metal 112-2 may be a different metal from the gate metal 112-1; in other embodiments, the gate metal 112-2 and the gate metal 112-1 may have the same material composition. In some embodiments, the gate metal 112-2 may be a superconductor, such as aluminum, titanium nitride (e.g., deposited via atomic layer deposition), or niobium titanium nitride. In some embodiments, the hardmask 118-2 may not be present in the quantum dot device 100 (e.g., a hardmask like the hardmask 118-2 may be removed during processing, as discussed below).

The gate 108-11 may extend between the proximate spacers 134-1 on the sides of the gate 106-11 and the gate 106-12, as shown in FIG. 2. In some embodiments, the gate metal 112-1 of the gate 108-11 may extend between the spacers 134-1 on the sides of the gate 106-11 and the gate 106-12. Thus, the gate metal 112-1 of the gate 108-11 may have a shape that is substantially complementary to the shape of the spacers 134-1, as shown. Similarly, the gate 108-12 may extend between the proximate spacers 134-1 on the sides of the gate 106-12 and the gate 106-13. The gates 106-2/108-2 and the dielectric material 114-2 of the second set of gates 105-2 may take the form of any of these embodiments of the gates 106-1/108-1 and the dielectric material 114-1. As illustrated in FIGS. 1 and 2, in some embodiments, the gates 106-1/108-1 may be mirror images of the gates 106-2/108-2 around the quantum well stack 147. In some embodiments in which the gate dielectric 114 is not a layer shared commonly between the associated gates 106 and 108, but instead is separately deposited on the fin 104 between the associated spacers 134 (e.g., as discussed below with reference to FIGS. 55-58), the gate dielectric 114 may extend at least partially up the sides of the associated spacers 134, and the gate metal 112 may extend between the portions of the associated gate dielectric 114 on the associated spacers 134.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the one illustrated in FIG. 2, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and towards the other fin 104, but may be isolated from their counterpart gates by the intervening insulating material 130 and spacers 134.

As shown in FIG. 2, the gates 106 and 108 of each set 105 may be alternatingly arranged along the fin 104 in the x-direction. During operation of the quantum dot device 100, voltages may be applied to the gates 106-1/108-1 to adjust the potential energy in the quantum well layer 152-1 in the fin 104 to create quantum wells of varying depths in which quantum dots 142-1 may form. Similarly, voltages may be applied to the gates 106-2/108-2 to adjust the potential energy in the quantum well layer 152-2 in the fin 104 to create quantum wells of varying depths in which quantum dots 142-2 may form. Only one quantum dot 142-1 and one quantum dot 142-2 are labeled with a reference numeral in FIG. 2 for ease of illustration, but five are indicated as dotted circles in each fin 104. The spacers 134 may themselves provide "passive" barriers between quantum wells under the gates 106/108 in the associated quantum well layer 152, and the voltages applied to different ones of the gates 106/108 may adjust the potential energy under the gates 106/108 in the quantum well layer; decreasing the potential energy may form quantum wells, while increasing the potential energy may form quantum barriers. The discussion below may generally refer to gates 106/108, quantum dots 142, and quantum well layers 152. This discussion may apply to the gates 106-1/108-1, quantum dots 142-1, and quantum well layer 152-1, respectively; to the gates 106-2/108-2, quantum dots 142-2, and quantum well layer 152-2, respectively; or to both.

The fins 104 may include doped regions 140 that may serve as a reservoir of charge carriers for the quantum dot device 100. In particular, the doped regions 140-1 may be in conductive contact with the quantum well layer 152-1, and the doped regions 140-2 may be in conductive contact with the quantum well layer 152-2. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown by the interface material 141-1 at the surface of the doped regions 140-1 and the interface material 141-2 at the surface of the doped regions 140-2. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 22-23). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in the associated quantum well layer 152 in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in the associated quantum well layer 152 in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142-1 under a gate 106-1 and another quantum dot 142-1 under a gate 108-1) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and with the doped regions 140, to enable electrical connection to the gates 106/108 and the doped regions 140 to be made in desired locations. As shown in FIGS. 1-3, the gates 106-1 may extend away from the fins 104, and conductive vias 120-1 may extend through the insulating material 130-2 to contact the gate metal 110-1 of the gates 106-1. The gates 108-1 may extend away from the fins 104, and conductive vias 122-1 may extend through the insulating material 130-2 to contact the gate metal 112-1 of the gates 108-1. The gates 106-2 may extend away from the fins 104, and conductive vias 120-2 may contact the gates 106-2 (and are drawn in dashed lines in FIG. 2 to indicate their location behind the plane of the drawing). The conductive vias 120-2 may extend through the hardmask 116-2 and the hardmask 118-2 to contact the gate metal 110-2 of the gates 106-2. The gates 108-2 may extend away from the fins 104, and conductive vias 122-2 may contact the gates 108-2 (also drawn in dashed lines in FIG. 2 to indicate their location behind the plane of the drawing). The conductive vias 122-2 may extend through the hardmask 118-2 to contact the gate metal 112-2 of the gates 108-2. Conductive vias 136 may contact the interface material 141 and may thereby make electrical contact with the doped regions 140. In particular, the conductive vias 136-1 may extend through the insulating material 130 and make contact with the doped regions 140-1, and the conductive vias 136-2 may extend through the insulating material 130 and make contact with the doped regions 140-2. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

The conductive pathways that contact the gates 106-1/108-1 (e.g., the conductive vias 120-1 and 122-1) may extend from the gates 106-1/108-1 to a first face 117-1 of the quantum dot device 100, while the conductive pathways that contact the gates 106-2/108-2 (e.g., the conductive vias 120-2 and 122-2) may extend from the gates 106-2/108-2 to a second face 117-2 of the quantum dot device 100. Similarly, the conductive pathways that contact the doped regions 140-1 (e.g., the conductive vias 136-1) may extend from the interface material 141-1 to the first face 117-1 of the quantum dot device 100, and the conductive pathways that contact the doped regions 140-2 (e.g., the conductive vias 136-2) may extend from the interface material 141-2 to the second face 117-2 of the quantum dot device 100. As illustrated in FIGS. 1 and 2, the first face 117-1 and the second face 117-2 may be opposite faces of the quantum dot device 100. In some embodiments, the first face 117-1 and the second face 117-2 may be opposing faces of a die (e.g., as discussed below with reference to FIGS. 59 and 60). The quantum dot device 100 may thus be a "double-sided" device in which electrical contact may be made to components within the quantum dot devices 100 through at least two different faces of the quantum dot device 100.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2. The insulating material 130-1 and the spacers 134-1 may separate the sets of gates 105-1 on the different fins 104-1 and 104-2, and the insulating material 130-2 and the spacers 134-2 may separate the sets of gates 105-2 on the different fins 104-1 and 104-2.

In some embodiments, the quantum dots 142-2 in a fin 104 may be used as "active" quantum dots in the sense that these quantum dots 142-2 act as qubits and are controlled (e.g., by voltages applied to the gates 106-2/108-2 of the fin 104-1) to perform quantum computations. The quantum dots 142-1 in a fin 104 may be used as "read" quantum dots in the sense that these quantum dots 142-2 may sense the quantum state of the quantum dots 142-2 in the same fin 104 by detecting the electric field generated by the charge in the quantum dots 142-1, and may convert the quantum state of the quantum dots 142-2 into electrical signals that may be detected by the gates 106-1/108-1. Each quantum dot 142-2 in a fin 104 may be read by its corresponding quantum dot 142-1 in the fin 104. Thus, the quantum dot device 100 enables both quantum computation and the ability to read the results of a quantum computation within a single fin, if desired.

In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation across two fins 104.

The quantum dot devices 100 disclosed herein may be manufactured using any suitable techniques. FIGS. 4-28 illustrate various example stages in the manufacture of the quantum dot device 100 of FIGS. 1-3, in accordance with various embodiments. Although the particular manufacturing operations discussed below with reference to FIGS. 4-28 are illustrated as manufacturing a particular embodiment of the quantum dot device 100, these operations may be applied to manufacture many different embodiments of the quantum dot device 100, as discussed herein. Any of the elements discussed below with reference to FIGS. 4-28 may take the form of any of the embodiments of those elements discussed above (or otherwise disclosed herein). For ease of illustration, not all elements in each of FIGS. 4-28 are expressly labeled with reference numerals, but reference numerals for each element are included among the drawings of FIGS. 4-28.

Figure 4:
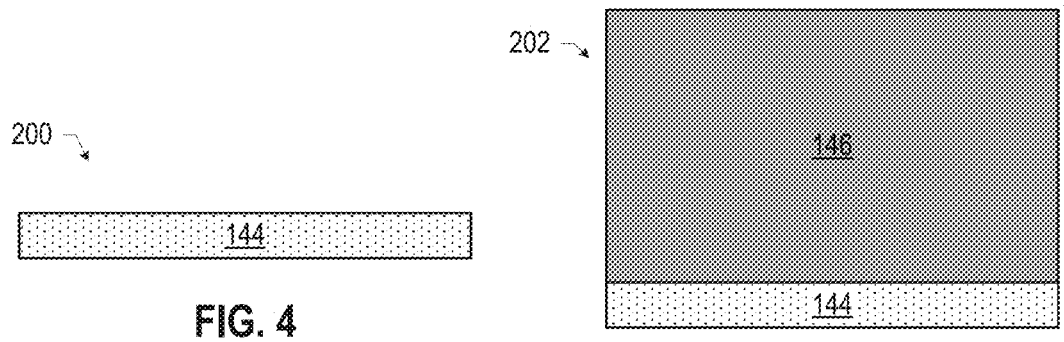
FIGS. 4-28 illustrate various example stages in the manufacture of a quantum dot device, in accordance with various embodiments.

FIG. 4 illustrates a cross-sectional view of an assembly 200 including a substrate 144. The substrate 144 may include any suitable material or materials. In some embodiments, the substrate 144 may include a semiconductor material. For example, the substrate 144 may include silicon (e.g., may be formed from a silicon wafer).

Figure 5:
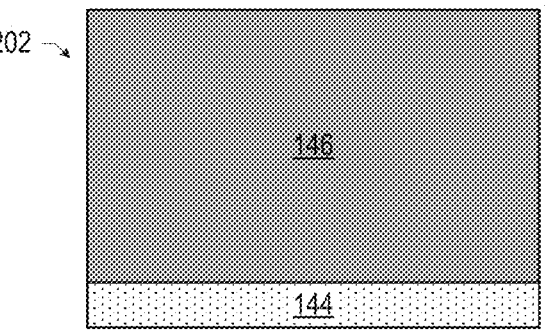

FIG. 5 illustrates a cross-sectional view of an assembly 202 subsequent to providing a material stack 146 on the substrate 144 of the assembly 200 (FIG. 4). The material stack 146 may include a quantum well layer 152-1, a quantum well layer 152-2, and a barrier layer 154 disposed therebetween. As discussed above, a 2DEG may form in the quantum well layer 152-1 and/or the quantum well layer 152-2 during operation of the quantum dot device 100. Various embodiments of the material stack 146 are discussed below with reference to FIGS. 50-51.

Figure 6:
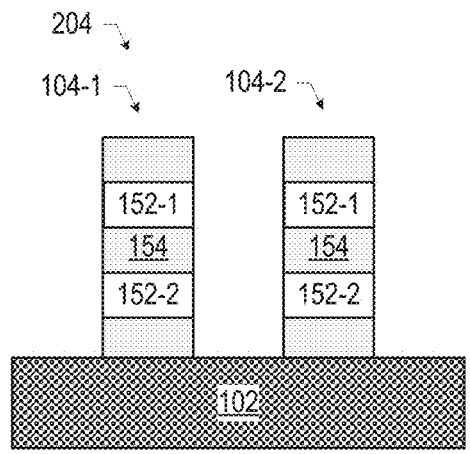

FIG. 6 illustrates a cross-sectional view of an assembly 204 subsequent to forming fins 104 in the assembly 202 (FIG. 5). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the material stack 146 may be included in the fins 104. In particular, the quantum well layers 152-1 and 152-2 (and the intervening barrier layer 154) of the material stack 146 may be included in the fins 104.

Figure 7:
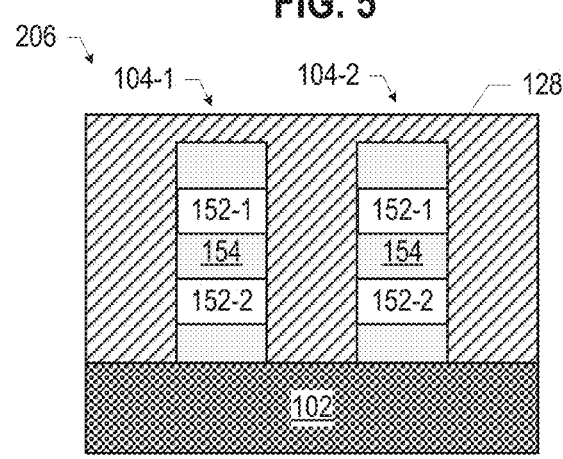

FIG. 7 illustrates a cross-sectional view of an assembly 206 subsequent to providing an insulating material 128 to the assembly 204 (FIG. 6). Any suitable material may be used as the insulating material 128 to electrically insulate the fins 104 from each other. As noted above, in some embodiments, the insulating material 128 may be a dielectric material, such as silicon oxide.

Figure 8:
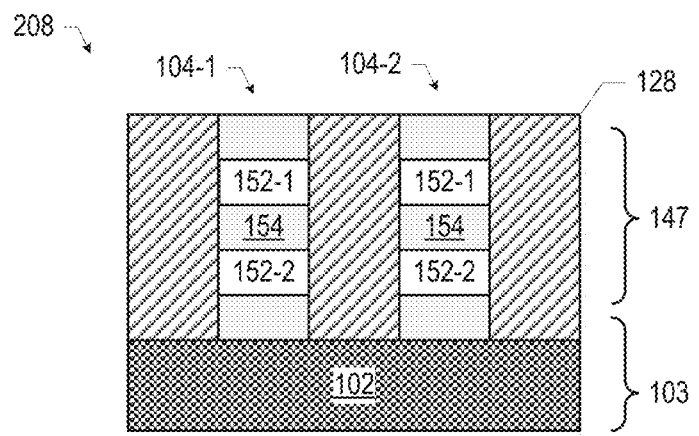

FIG. 8 illustrates a cross-sectional view of an assembly 208 subsequent to planarizing the assembly 206 (FIG. 7) to remove the insulating material 128 above the fins 104. In some embodiments, the assembly 206 may be planarized using a chemical mechanical polishing (CMP) technique. As illustrated in FIG. 8, the assembly 208 may be viewed as including a quantum well stack 147 and a support 103. The quantum well stack 147 includes the quantum well layers 152-1 and 152-2, and the intervening barrier layer 154, of the material stack 146 (and may include additional material in the material stack 146), while the support 103 includes the base 102 (and may include additional material in the material stack 146). As discussed below with reference to FIG. 26, the portion of the assembly 208 designated as the support 103 may be removed during manufacture of the quantum dot device 100, and the portion of the assembly 208 designated as the quantum well stack 147 may remain in the quantum dot device 100.

Figure 9:
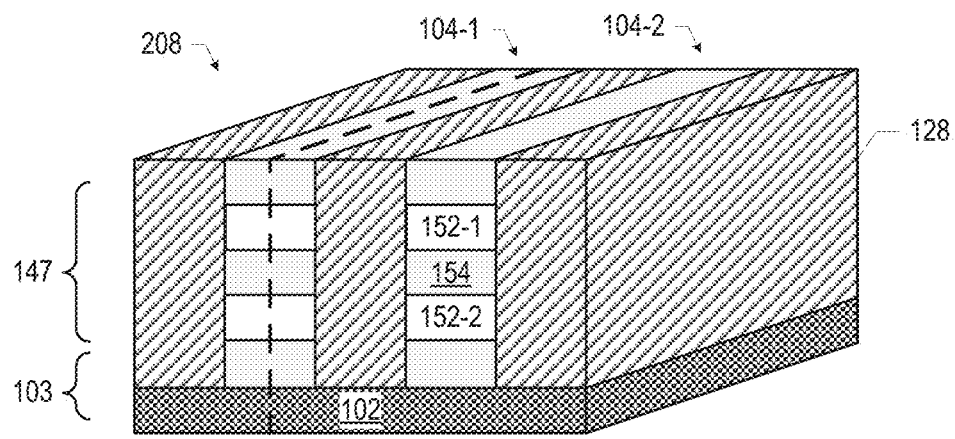
Figure 10:
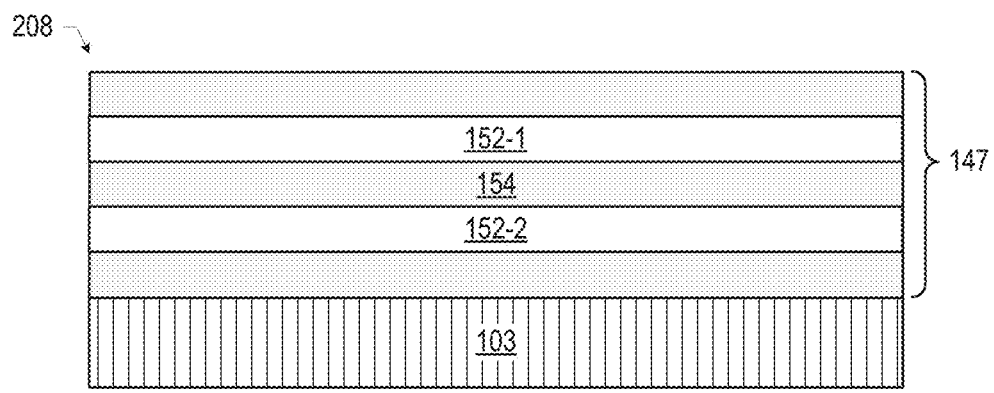

FIG. 9 is a perspective view of at least a portion of the assembly 208, showing the fins 104 extending from the base 102 and separated by the insulating material 128. The cross-sectional views of FIGS. 4-8 are taken parallel to the plane of the page of the perspective view of FIG. 9. FIG. 10 is another cross-sectional view of the assembly 208, taken along the dashed line along the fin 104-1 in FIG. 9. The cross-sectional views illustrated in FIGS. 11-28 are taken along the same cross-section as FIG. 10.

Figure 11:
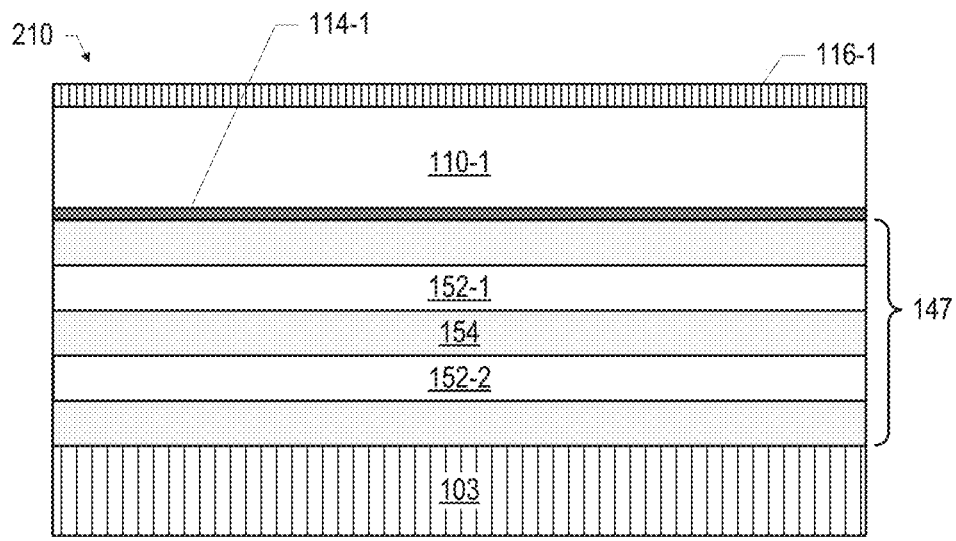

FIG. 11 is a cross-sectional view of an assembly 210 subsequent to forming a gate stack on the fins 104 of the assembly 208 (FIGS. 8-10). The gate stack may include the gate dielectric 114-1, the gate metal 110-1, and a hardmask 116-1. The hardmask 116-1 may be formed of an electrically insulating material, such as silicon nitride or carbon-doped nitride.

Figure 12:
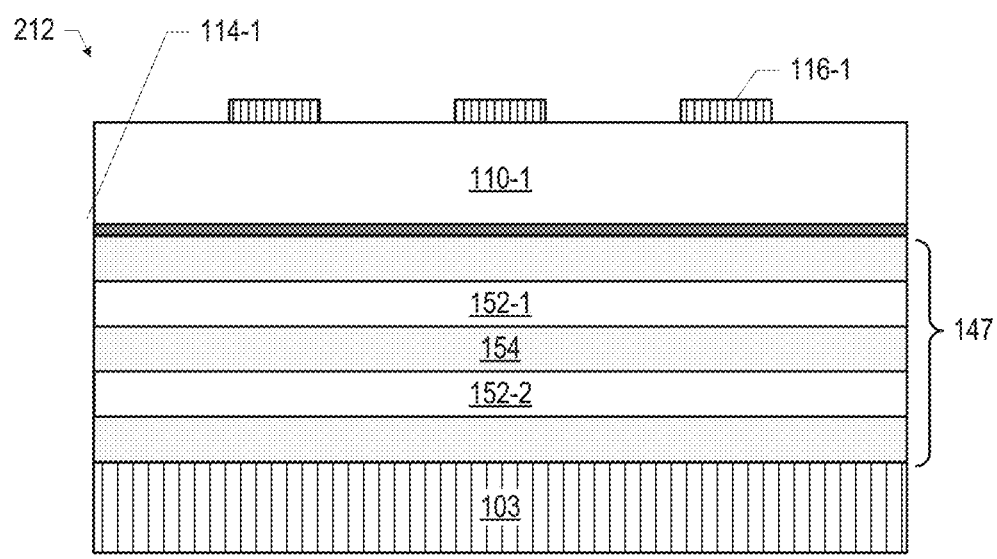

FIG. 12 is a cross-sectional view of an assembly 212 subsequent to patterning the hardmask 116-1 of the assembly 210 (FIG. 11). The pattern applied to the hardmask 116-1 may correspond to the locations for the gates 106-1, as discussed below. The hardmask 116-1 may be patterned by applying a resist, patterning the resist using lithography, and then etching the hardmask (using dry etching or any appropriate technique).

Figure 13:
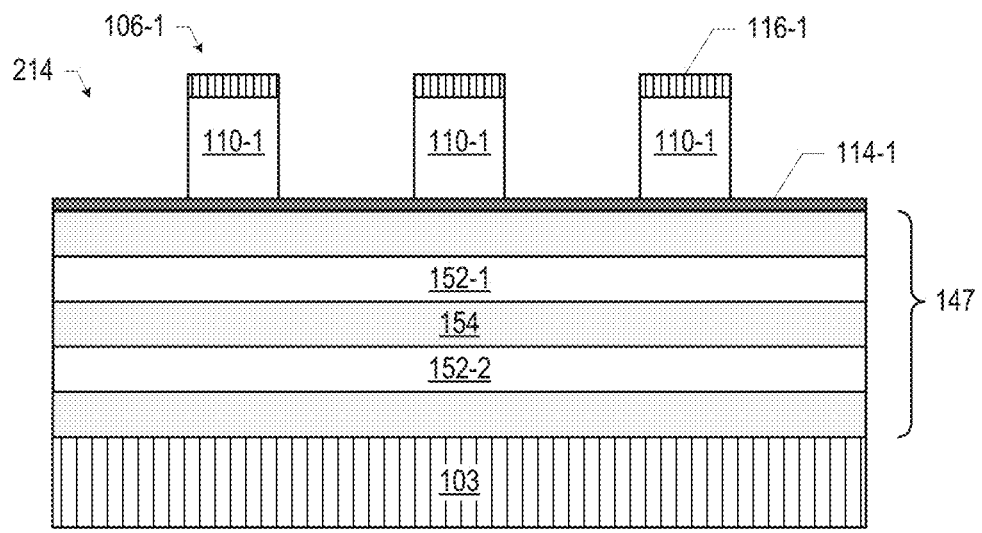

FIG. 13 is a cross-sectional view of an assembly 214 subsequent to etching the assembly 212 (FIG. 12) to remove the gate metal 110-1 that is not protected by the patterned hardmask 116-1 to form the gates 106-1. In some embodiments, as illustrated in FIG. 13, the gate dielectric 114-1 may remain after the etched gate metal 110-1 is etched away; in other embodiments, the gate dielectric 114-1 may also be etched during the etching of the gate metal 110-1. Examples of such embodiments are discussed below with reference to FIGS. 55-58.

Figure 14:
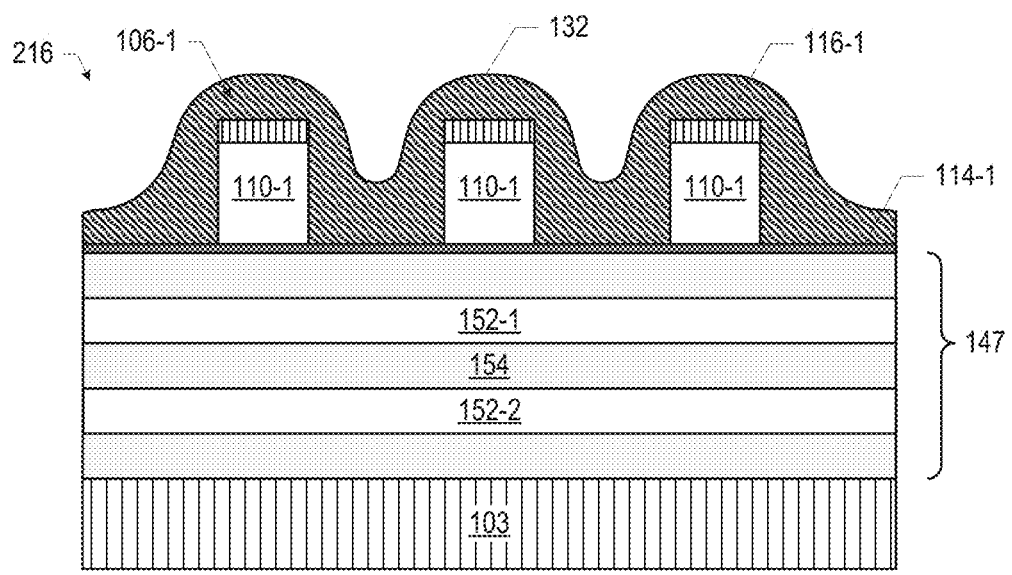

FIG. 14 is a cross-sectional view of an assembly 216 subsequent to providing spacer material 132 on the assembly 214 (FIG. 13). The spacer material 132 may include any of the materials discussed above with reference to the spacers 134-1, for example, and may be deposited using any suitable technique. For example, the spacer material 132 may be a nitride material (e.g., silicon nitride) deposited by sputtering.

Figure 15:
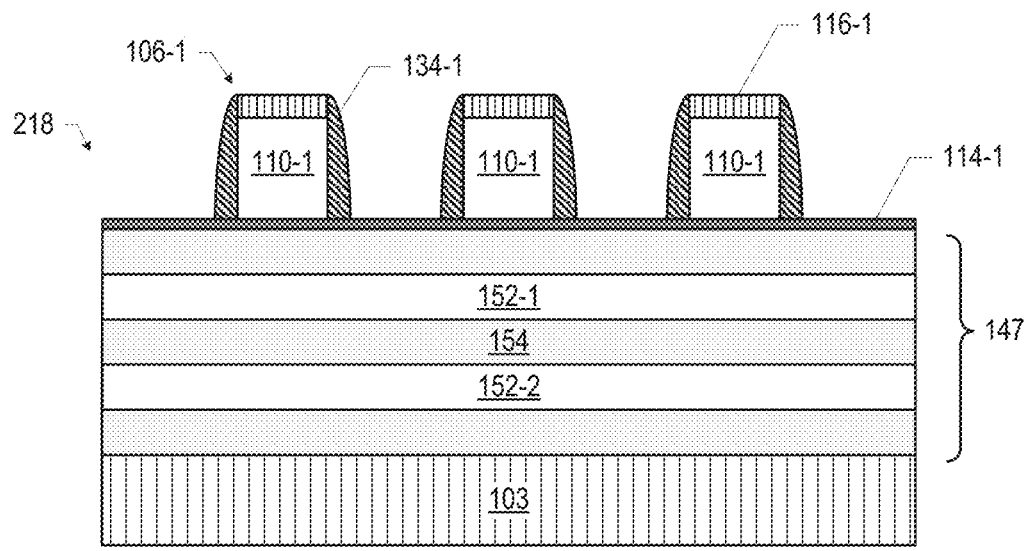

FIG. 15 is a cross-sectional view of an assembly 218 subsequent to etching the spacer material 132 of the assembly 216 (FIG. 14), leaving spacers 134-1 formed of the spacer material 132 on the sides of the gates 106-1 (e.g., on the sides of the hardmask 116-1 and the gate metal 110-1). The etching of the spacer material 132 may be an anisotropic etch, etching the spacer material 132 "downward" to remove the spacer material 132 on top of the gates 106-1 and in some of the area between the gates 106-1, while leaving the spacers 134-1 on the sides of the gates 106. In some embodiments, the anisotropic etch may be a dry etch.

Figure 16:
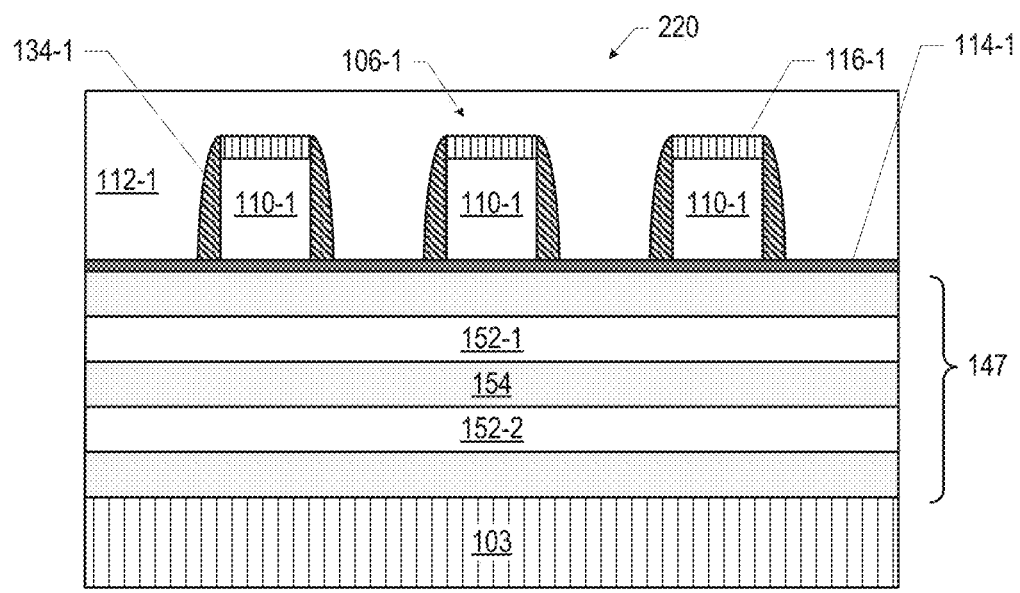

FIG. 16 is a cross-sectional view of an assembly 220 subsequent to providing the gate metal 112-1 on the assembly 218 (FIG. 15). The gate metal 112-1 may fill the areas between adjacent ones of the gates 106-1, and may extend over the tops of the gates 106-1.

Figure 17:
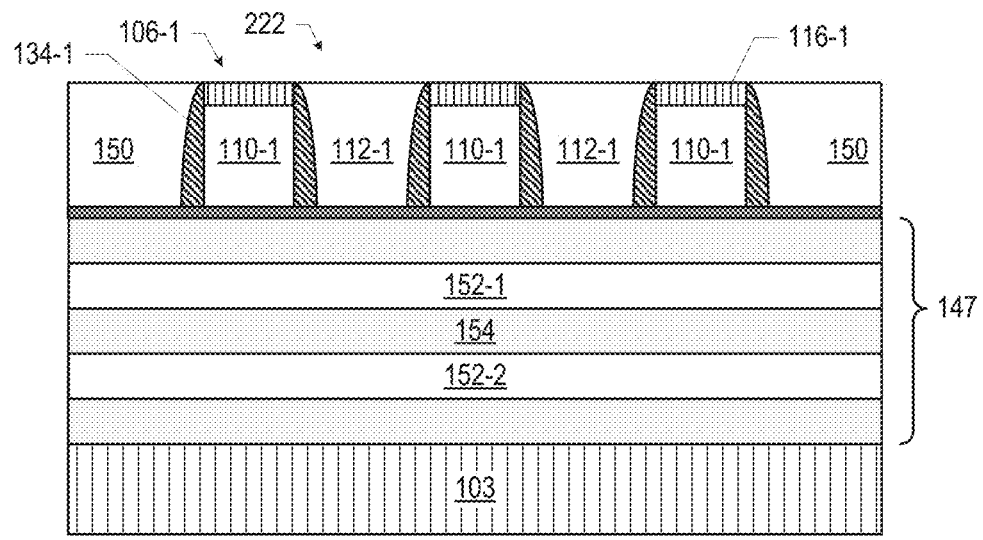

FIG. 17 is a cross-sectional view of an assembly 222 subsequent to planarizing the assembly 220 (FIG. 16) to remove the gate metal 112-1 above the gates 106-1. In some embodiments, the assembly 220 may be planarized using a CMP technique. Some of the remaining gate metal 112-1 may fill the areas between adjacent ones of the gates 106-1, while other portions 150 of the remaining gate metal 112-1 may be located "outside" of the gates 106-1.

Figure 18:
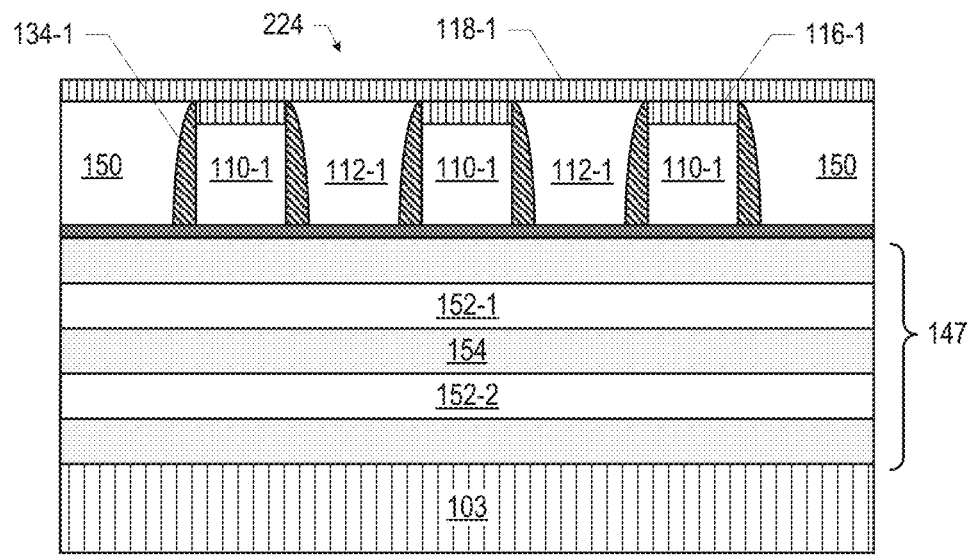

FIG. 18 is a cross-sectional view of an assembly 224 subsequent to providing a hardmask 118-1 on the planarized surface of the assembly 222 (FIG. 17). The hardmask 118-1 may be formed of any of the materials discussed above with reference to the hardmask 116-1, for example.

Figure 19:
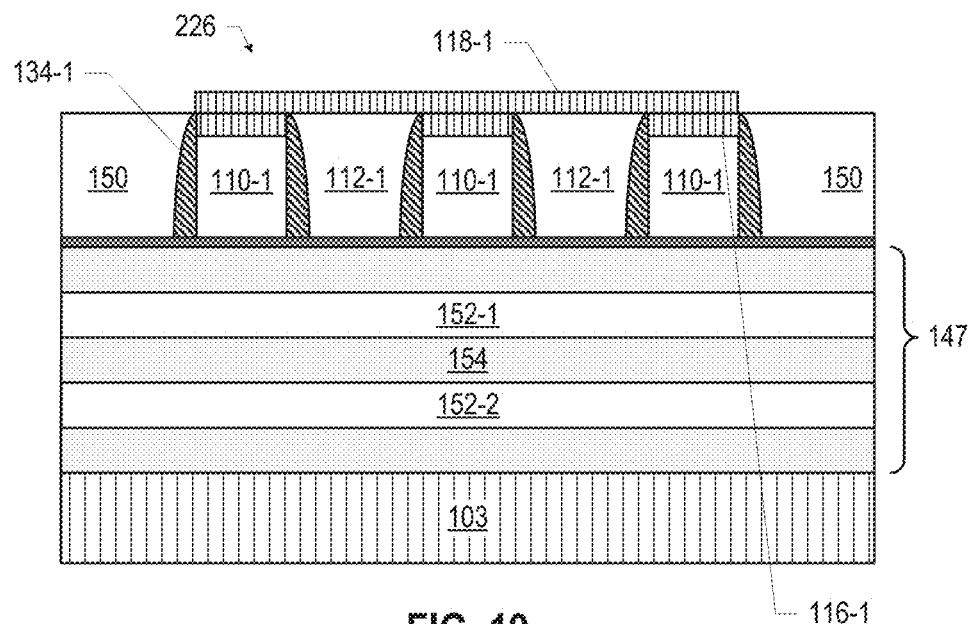

FIG. 19 is a cross-sectional view of an assembly 226 subsequent to patterning the hardmask 118-1 of the assembly 224 (FIG. 18). The pattern applied to the hardmask 118-1 may extend over the hardmask 116-1 (and over the gate metal 110-1 of the gates 106-1, as well as over the locations for the gates 108-1 (as illustrated in FIG. 2). The hardmask 118-1 may be non-coplanar with the hardmask 116-1, as illustrated in FIG. 19. The hardmask 118-1 illustrated in FIG. 19 may thus be a common, continuous portion of hardmask 118-1 that extends over all of the hardmask 116-1. The hardmask 118-1 may be patterned using any of the techniques discussed above with reference to the patterning of the hardmask 116-1, for example.

Figure 20:
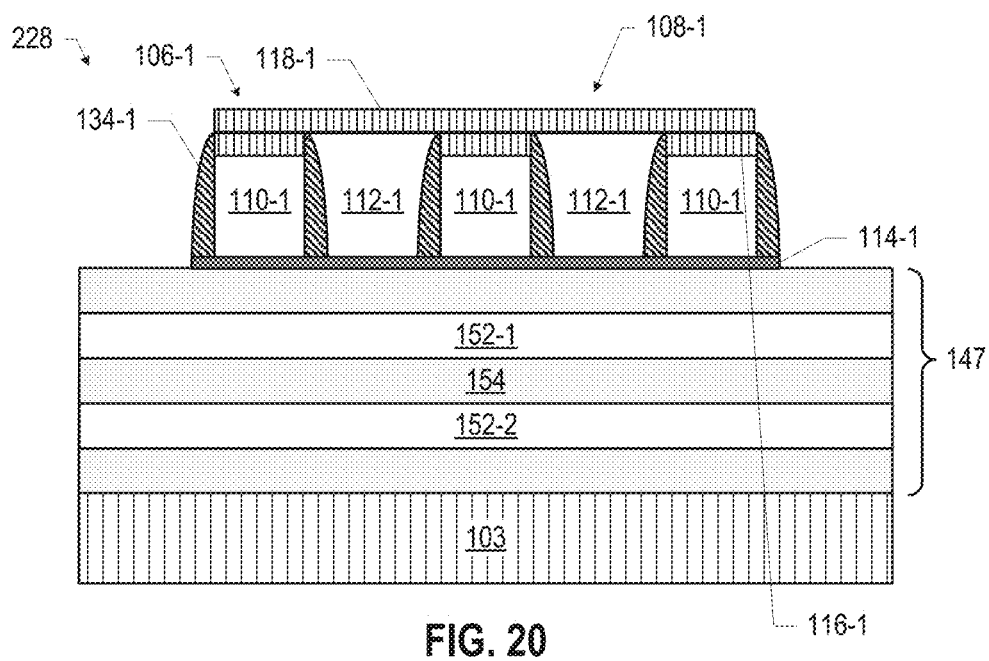

FIG. 20 is a cross-sectional view of an assembly 228 subsequent to etching the assembly 226 (FIG. 19) to remove the portions 150 that are not protected by the patterned hardmask 118-1 to form the gates 108-1. Portions of the hardmask 118-1 may remain on top of the hardmask 116-1, as shown. The operations performed on the assembly 226 may include removing any gate dielectric 114-1 that is "exposed" on the fin 104, as shown. The excess gate dielectric 114-1 may be removed using any suitable technique, such as chemical etching or silicon bombardment. In some embodiments, the patterned hardmask 118 may extend "laterally" beyond the gates 106 to cover gate metal 112 that it located "outside" the gates 106. In such embodiments, those portions of gate metal 112 may remain in the assembly 238 and may provide the outermost gates (i.e., those gates 108 may bookend the other gates 106/108). The exposed gate metal 112 at the sides of those outer gates 108 may be insulated by additional spacers 134, formed using any of the techniques discussed herein. Such outer gates 108 may be included in any of the embodiments disclosed herein.

Figure 21:
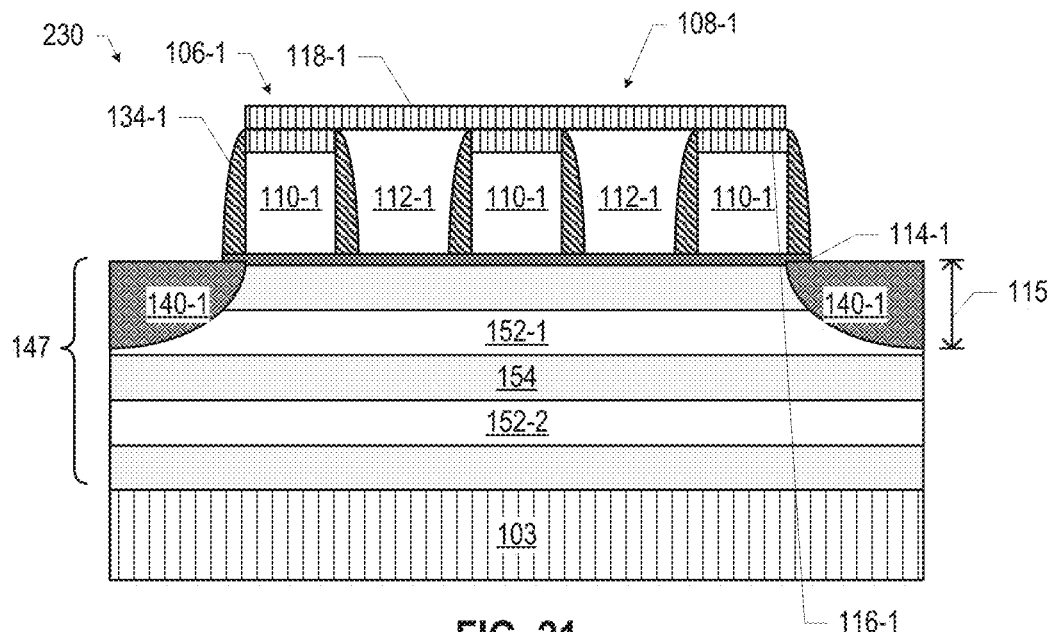

FIG. 21 is a cross-sectional view of an assembly 230 subsequent to doping the quantum well stack 147 of the assembly 228 (FIG. 20) to form doped regions 140-1. The doped regions 140-1 may be in conductive contact with the quantum well layer 152-1. The type of dopant used to form the doped regions 140-1 may depend on the type of quantum dot desired, as discussed above. In some embodiments, the doping may be performed by ion implantation. For example, when a quantum dot 142 is to be an electron-type quantum dot 142, the doped regions 140-1 may be formed by ion implantation of phosphorous, arsenic, or another n-type material. When a quantum dot 142 is to be a hole-type quantum dot 142, the doped regions 140-1 may be formed by ion implantation of boron or another p-type material. An annealing process that activates the dopants and causes them to diffuse farther into the quantum well stack 147 may follow the ion implantation process. The depth of the doped regions 140-1 may take any suitable value; for example, in some embodiments, the doped regions 140-1 may each have a depth 115 between 500 and 1000 Angstroms.

The outer spacers 134-1 on the outer gates 106-1 may provide a doping boundary, limiting diffusion of the dopant from the doped regions 140-1 into the area under the gates 106-1/108-1. As shown, the doped regions 140-1 may extend under the adjacent outer spacers 134-1. In some embodiments, the doped regions 140-1 may extend past the outer spacers 134-1 and under the gate metal 110-1 of the outer gates 106-1, may extend only to the boundary between the outer spacers 134-1 and the adjacent gate metal 110-1, or may terminate under the outer spacers 134-1 and not reach the boundary between the outer spacers 134-1 and the adjacent gate metal 110-1. Examples of such embodiments are discussed below with reference to FIGS. 53 and 54. The doping concentration of the doped regions 140-1 may, in some embodiments, be between $10^{17}/cm^3$ and $10^{20}/cm^3$.

Figure 22:
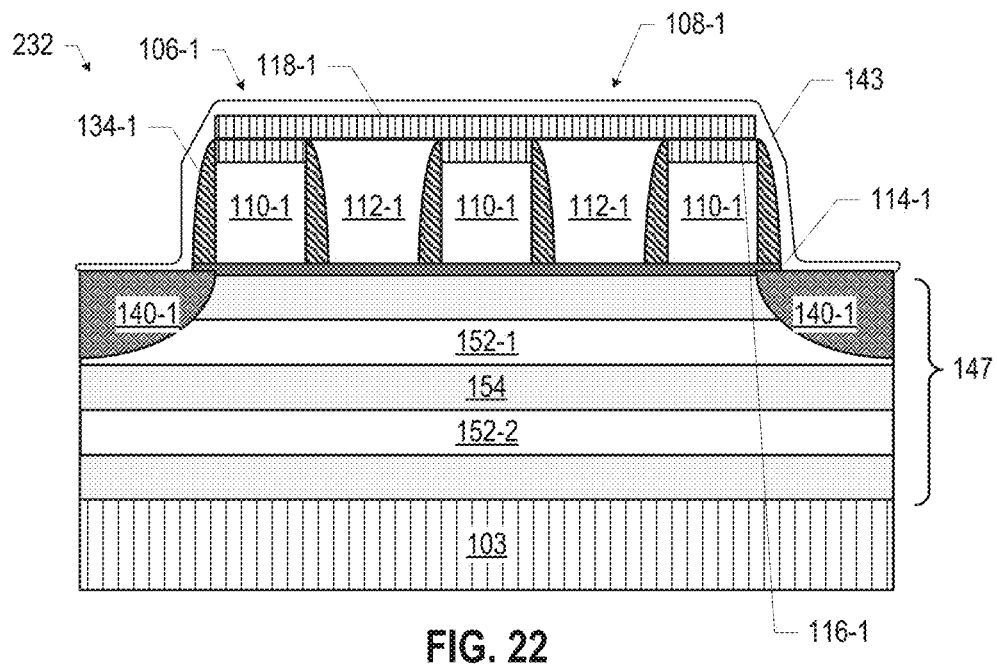

FIG. 22 is a cross-sectional side view of an assembly 232 subsequent to providing a layer of nickel or other material 143 over the assembly 230 (FIG. 21). The nickel or other material 143 may be deposited on the assembly 230 using any suitable technique (e.g., a plating technique, chemical vapor deposition, or atomic layer deposition).

Figure 23:
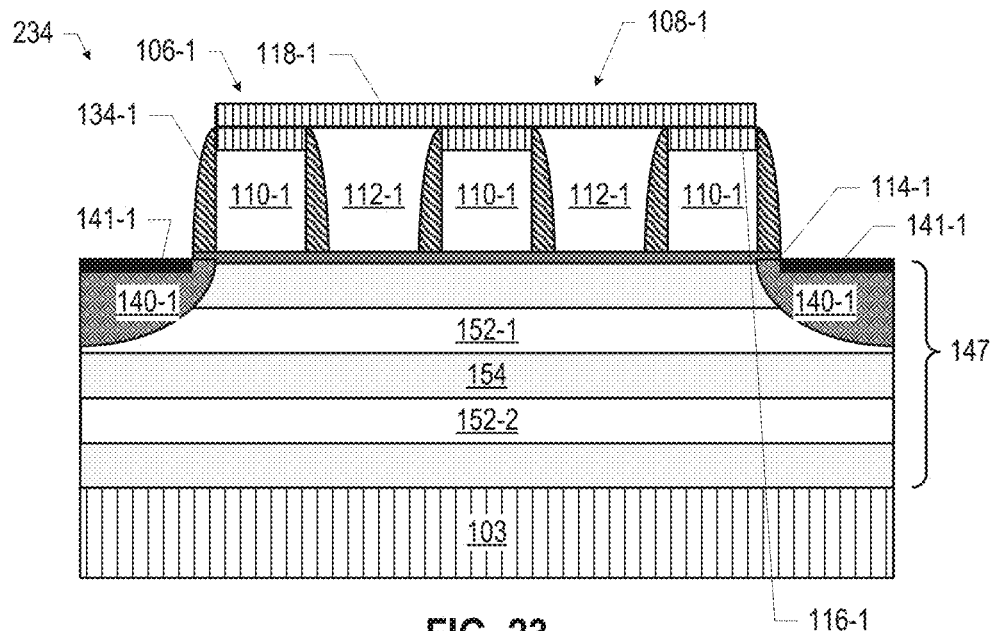

FIG. 23 is a cross-sectional side view of an assembly 234 subsequent to annealing the assembly 232 (FIG. 22) to cause the material 143 to interact with the doped regions 140-1 to form the interface material 141-1, then removing the unreacted material 143. When the doped regions 140-1 include silicon and the material 143 includes nickel, for example, the interface material 141-1 may be nickel silicide. Materials other than nickel may be deposited in the operations discussed above with reference to FIG. 22 in order to form other interface materials 141-1, including titanium, aluminum, molybdenum, cobalt, tungsten, or platinum, for example. More generally, the interface material 141-1 of the assembly 234 may include any of the materials discussed herein with reference to the interface material 141.

Figure 24:
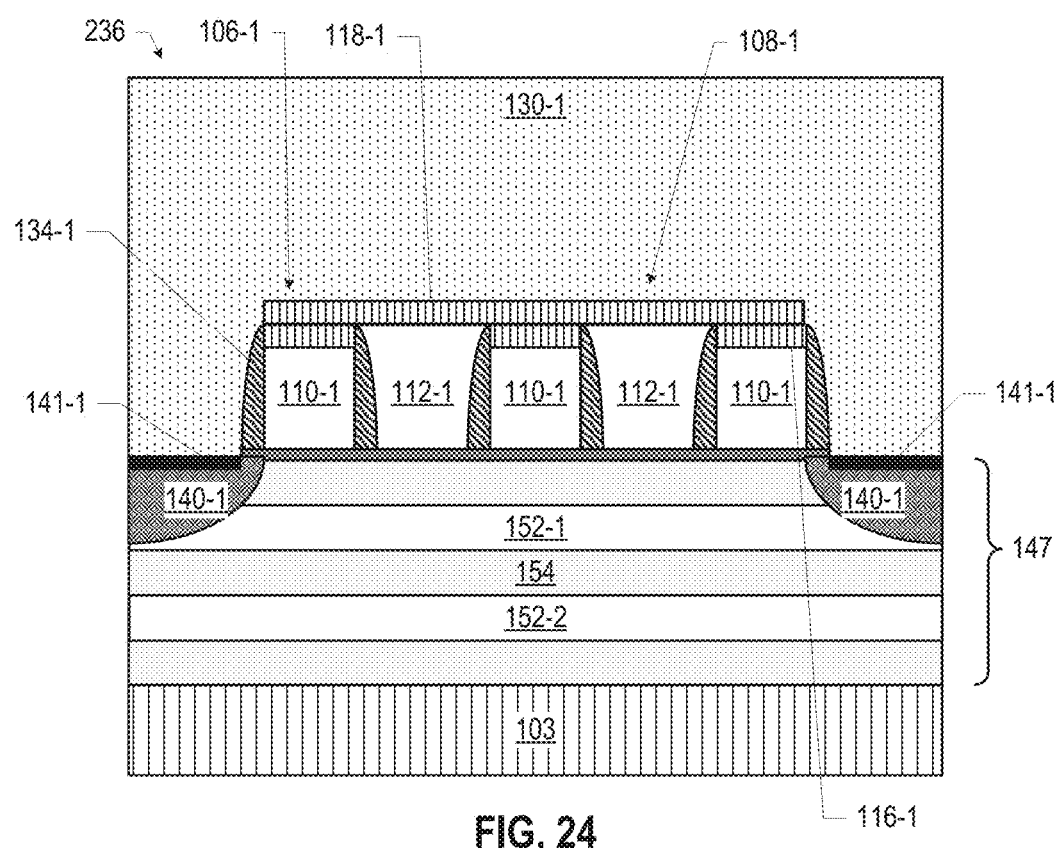

FIG. 24 is a cross-sectional view of an assembly 236 subsequent to providing an insulating material 130-1 on the assembly 234 (FIG. 23). The insulating material 130-1 may take any of the forms discussed above. For example, the insulating material 130-1 may be a dielectric material, such as silicon oxide. The insulating material 130-1 may be provided on the assembly 234 using any suitable technique, such as spin coating, chemical vapor deposition (CVD), or plasma-enhanced CVD (PECVD). In some embodiments, the insulating material 130-1 may be polished back after deposition, and before further processing. In some embodiments, the assembly 236 may be planarized to remove the hardmasks 116-1 and 118-1, then additional insulating material 130-1 may optionally be provided on the planarized surface; in such an embodiment, the hardmasks 116-1 and 118-1 would not be present in the quantum dot device 100. In some embodiments, a nitride etch stop layer (NESL) may be provided on the assembly 234 (e.g., above the interface material 141) before providing the insulating material 130.

Figure 25:
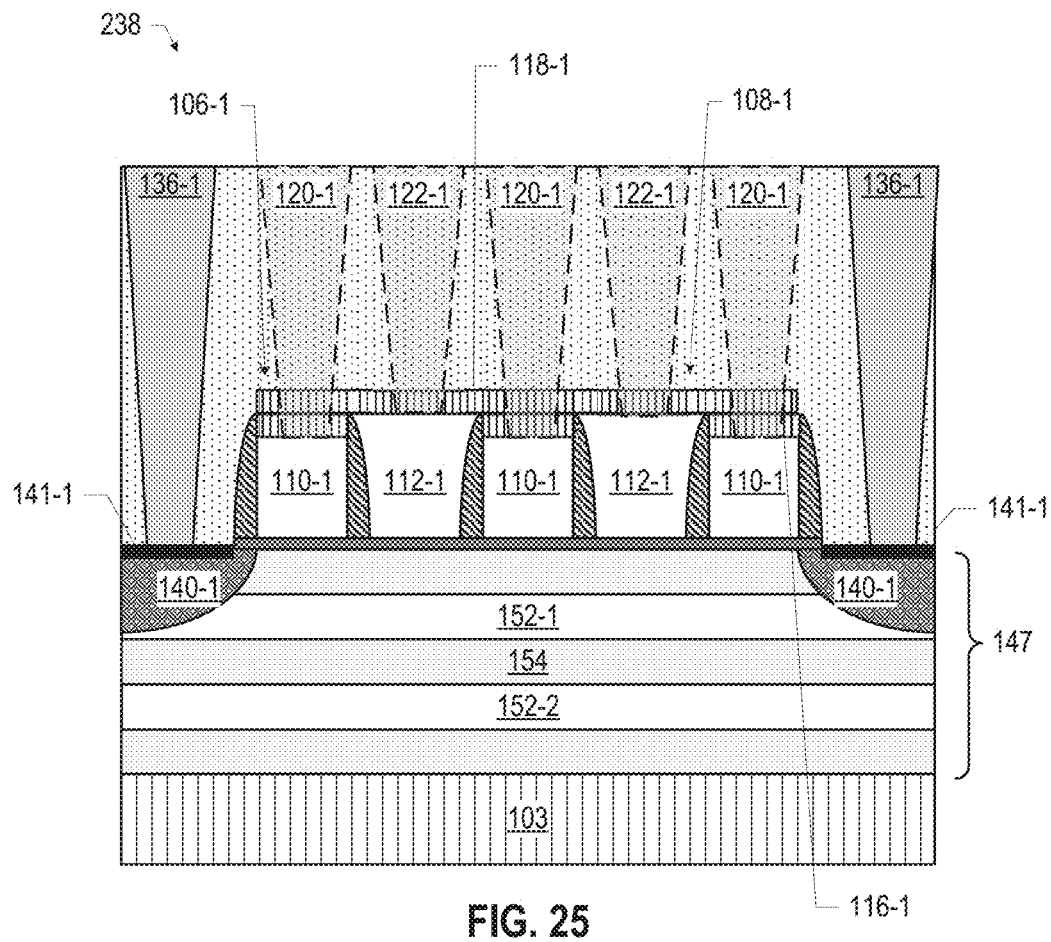

FIG. 25 is a cross-sectional view of an assembly 238 subsequent to forming, in the assembly 236 (FIG. 24), conductive vias 120-1 through the insulating material 130-1 (and the hardmasks 116-1 and 118-1) to contact the gate metal 110-1 of the gates 106-1, conductive vias 122-1 through the insulating material 130-1 (and the hardmask 118-1) to contact the gate metal 112-1 of the gates 108-1, and conductive vias 136-1 through the insulating material 130-1 to contact the interface material 141-1 of the doped regions 140-1. Further conductive vias and/or lines may be formed on the assembly 238 using conventional interconnect techniques, if desired.

Figure 26:
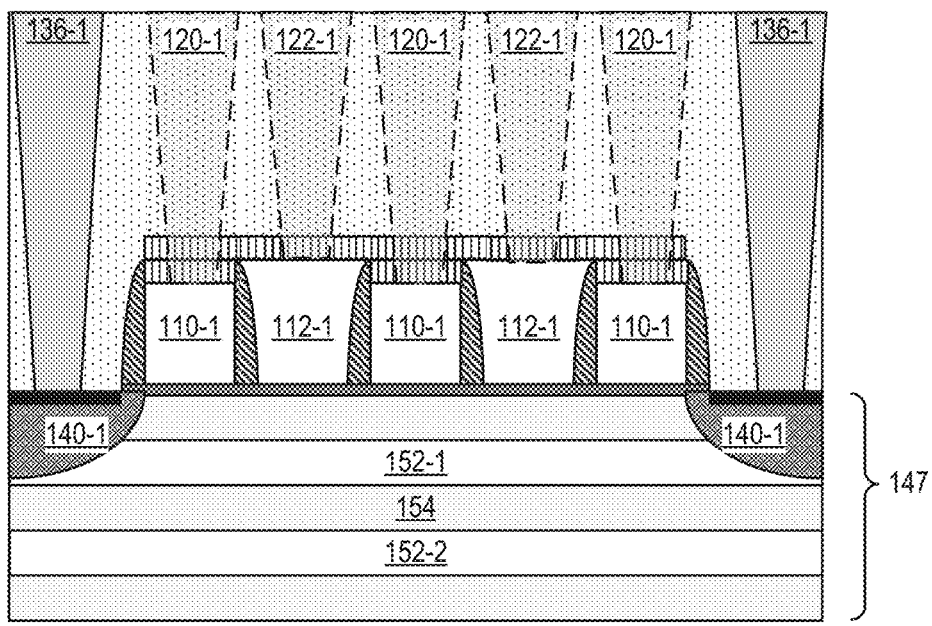

FIG. 26 is a cross-sectional view of an assembly 240 subsequent to removing the support 103 from the assembly 238 (FIG. 25). The quantum well stack 147 may remain secured to the gates 106-1/108-1 and the insulating material 130-1. Any suitable technique may be used to separate the support 103 from the rest of the assembly 238. For example, the support 103 is polished or etched away. In some embodiments, the base 102 may be mechanically separated from the rest of the assembly 238, and then the "broken" surface of the assembly 240 may be polished or etched. A CMP technique may be used to polish the assembly 238 when forming the assembly 240. In some embodiments, the support 103 may include the base 102 and at least some of the material stack 146; for example, some buffer material included in the material stack 146 (as discussed below with reference to FIGS. 50-51) may be removed as part of removal of the support 103.

Figure 27:
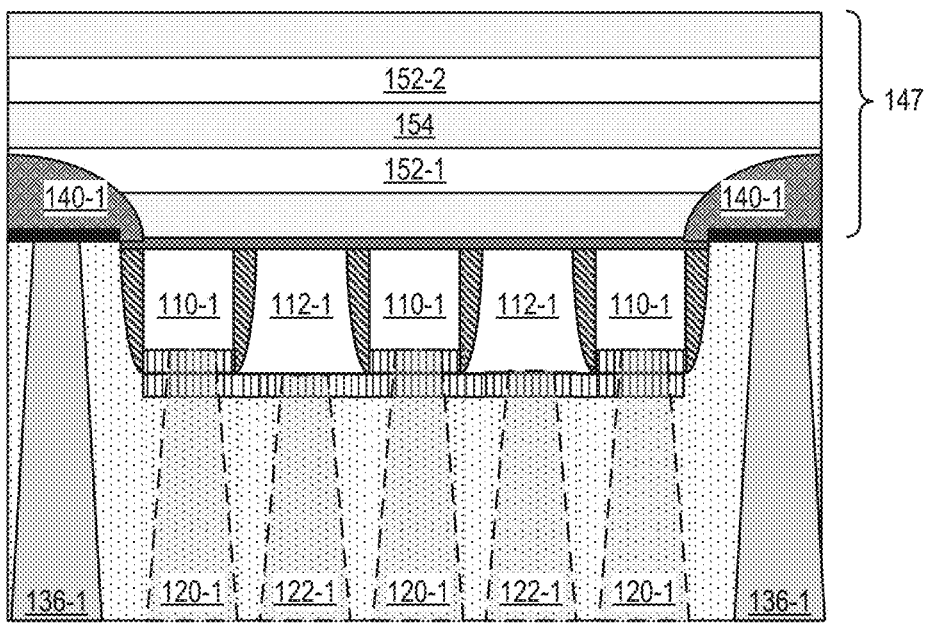

FIG. 27 is a cross-sectional view of an assembly 242 subsequent to turning the assembly 240 (FIG. 26) "upside down" so that further processing may be performed on the exposed surface of the quantum well stack 147. In some embodiments, the assembly 240 need not be physically reoriented (as illustrated in FIG. 27) in order for subsequent processing operations to be performed.

Figure 28:
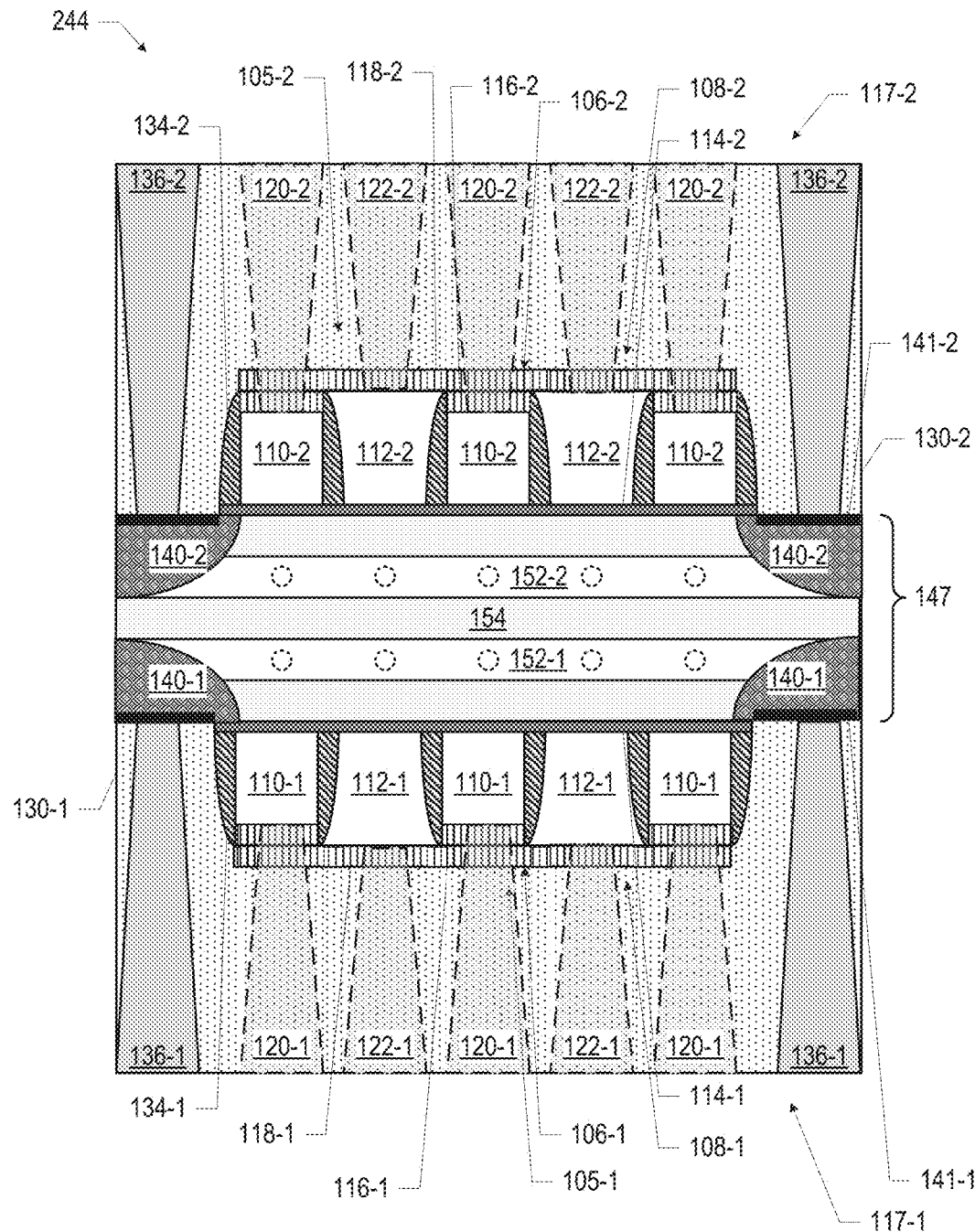

FIG. 28 is a cross-sectional view of an assembly 244 subsequent to forming gates 106-2/108-2 with a gate dielectric 114-2, doped regions 140-2, interface material 141-2, and conductive vias 120-2/122-2/136-2 on the quantum well stack 147 proximate to the quantum well layer 152-2. These structures may be formed using any of the techniques discussed above with reference to FIGS. 11-25. For example, as shown in FIG. 28, hardmasks 116-2 and 118-2 may be part of the gates 106-2/108-2, analogously to the hardmasks 116-1 and 118-1 of the gates 106-1/108-1. The resulting assembly 244 may take the form of the quantum dot device 100 discussed above with reference to FIGS. 1-3. In some embodiments, the assembly 244 may be planarized to remove the hardmasks 116-2 and 118-2, then additional insulating material 130-2 may be provided on the planarized surface before forming the conductive vias 120-2, 122-2, and 136-2; in such an embodiment, the hardmasks 116-2 and 118-2 would not be present in the quantum dot device 100. The conductive vias 120-1/122-1/136-1 may be part of conductive pathways that extend to the first face 117-1 of the quantum dot device 100, and the conductive vias 120-2/122-2/136-2 may be part of conductive pathways that extend to the second face 117-2 of the quantum dot device 100.

Figure 29:
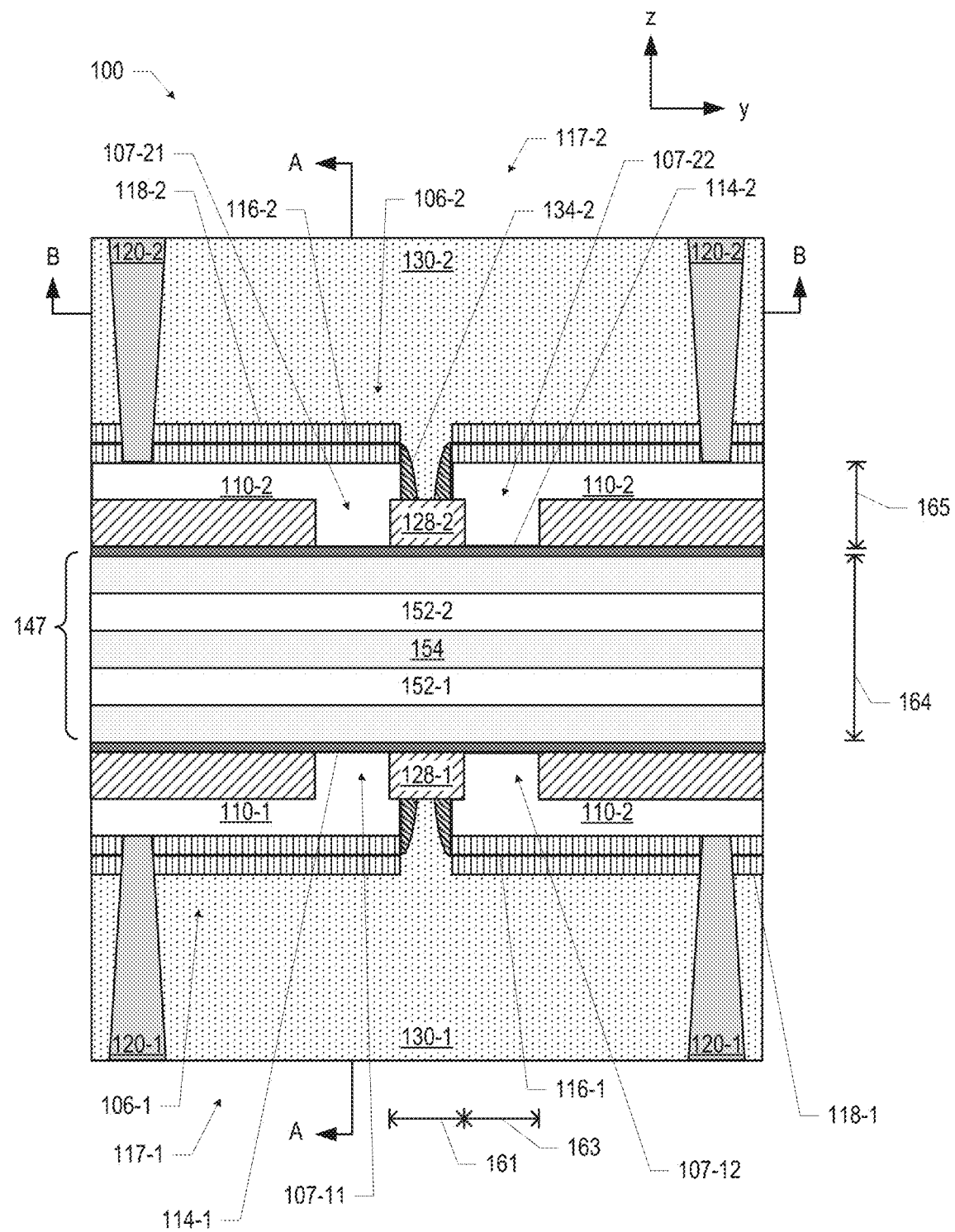
FIG. 29 is a cross-sectional view of another embodiment of a quantum dot device.

FIG. 29 is a cross-sectional view of another embodiment of a quantum dot device 100. The quantum dot device 100 of FIG. 29 may share the cross-sectional views of FIGS. 2 and 3 with the quantum dot device 100 of FIG. 1, but FIG. 29 illustrates a different structure of the quantum dot device 100 taken along the section C-C of FIG. 2. Although FIG. 29 indicates that the cross section illustrated in FIG. 2 is taken through the trench 107-1, an analogous cross section taken through the trench 107-2 may be identical, and thus the discussion of the quantum dot device 100 of FIG. 29 may refer generally to the "trench 107."

Like the quantum dot device 100 of FIG. 1, the quantum dot device 100 of FIG. 29 may include a quantum well stack 147. However, the quantum dot device 100 of FIG. 29 may include portions of insulating material 128-1 disposed above the quantum well stack 147, and multiple trenches 107-1 in the insulating material 128-1 may extend toward the quantum well stack 147. The gate dielectric 114-1 may be disposed between the quantum well stack 147 and the insulating material 128-1 so as to provide the "bottom" of the trenches 107-1. Analogous structures may be disposed on the other face of the quantum well stack 147, so as to form a double-sided structure.

Although only two trenches, 107-11 and 107-12, are shown in the insulating material 128-1 of FIG. 29 (and only two trenches 107-21 and 107-22 in the insulating material 128-2), this is simply for ease of illustration, and more than two trenches 107 may be included in the insulating material 128 disposed on a face of the quantum well stack 147 in the quantum dot device 100 (e.g., in any of the manners discussed above with reference to the fins 104 of the quantum dot device 100 of FIG. 1). The discussion herein will largely focus on a single pair of trenches 107 for ease of illustration, but all the teachings of the present disclosure apply to quantum dot devices 100 with more trenches 107.

The quantum well stack 147 may take the form of any of the quantum well stacks 147 discussed herein. In the quantum dot device 100 of FIG. 29, a quantum well layer 152 itself may provide a geometric constraint on the z-location of quantum dots in the quantum well stack 147; to control the x- and y-location of quantum dots in the quantum well stack 147, voltages may be applied to gates disposed at least partially in the trenches 107 above the quantum well stack 147 to adjust the energy profile along the trenches 107 in the x- and y-direction and thereby constrain the x- and y-location of quantum dots within quantum. The dimensions of the trenches 107 may take any suitable values. For example, in some embodiments, the trenches 107 may each have a width 163 between 10 and 30 nanometers. In some embodiments, the trenches 107 may each have a depth 165 between 200 and 400 nanometers (e.g., between 250 and 350 nanometers, or equal to 300 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 107 may be spaced apart by a distance 161 between 100 and 250 nanometers.

Multiple gates may be disposed at least partially in each of the trenches 107. The cross-sectional views of these gates along the section A-A may take any of the forms discussed above with reference to FIG. 2. In the embodiment of FIG. 29, the gate metal 110 of a gate 106 may extend over the insulating material 128 and into a trench 107 in the insulating material 128. As illustrated in FIG. 29, no spacer material may be disposed between the gate metal 110 and the sidewalls of the trench 107 in the y-direction.

In the embodiment of FIG. 29, the gate metal 112 of a gate 108 (not shown, but analogous to the gate metal 110 of a gate 106) may extend over the insulating material 128 and into a trench 107 in the insulating material 128. As discussed above with reference to FIG. 2, the gate 108-1 may extend between the proximate spacers 134 on the sides of the gate 106-1 and the gate 106-2 along the longitudinal axis of the trench 107. In some embodiments in which the gate dielectric 114 is not a layer shared commonly between the gates 108 and 106, but instead is separately deposited in the trench 107 between the spacers 134 (e.g., as discussed below with reference to FIGS. 55-58), the gate dielectric 114 may extend at least partially up the sides of the spacers 134 (and up the proximate sidewalls of the trench 107), and the gate metal 112 may extend between the portions of gate dielectric 114 on the spacers 134 (and the proximate sidewalls of the trench 107). In some embodiments, no spacer material may be disposed between the gate metal 112 and the sidewalls of the trench 107 in the y-direction (e.g., as discussed below with reference to FIGS. 30-49); in other embodiments, spacers 134 may also be disposed between the gate metal 112 and the sidewalls of the trench 107 in the y-direction.

The quantum dot device 100 of FIG. 29 may include doped regions 140, interface materials 141, conductive pathways (e.g., conductive vias), and any other components in accordance with any of the embodiments described above with reference to the quantum dot device 100 of FIG. 1. The quantum dot device 100 of FIG. 29 may be used in any of the ways described above with reference to the quantum dot device 100 of FIG. 1.

The quantum dot device 100 of FIG. 29 may be manufactured using any suitable techniques. In some embodiments, the manufacture of the quantum dot device 100 of FIG. 29 may begin as described above with reference to FIGS. 4-5; however, instead of forming fins 104 in the material stack 146 of the assembly 202, manufacturing may proceed as illustrated in FIGS. 30-49 (and described below).

The support 103 is omitted from FIGS. 30-49 for economy of illustration, and operations are shown as performed on the quantum well stack 147.

Figure 30:
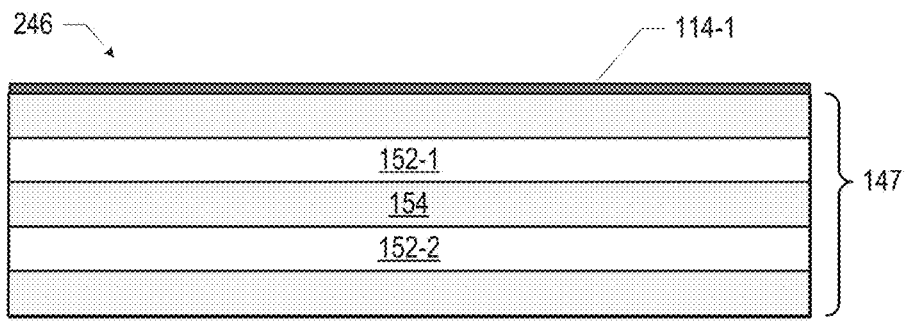
FIGS. 30-49 illustrate various example stages in the manufacture of the quantum dot device of FIG. 29, in accordance with various embodiments.

FIG. 30 is a cross-sectional view of an assembly 246 subsequent to providing a layer of gate dielectric 114-1 on the quantum well stack 147 of the assembly 202 (FIG. 5). In some embodiments, the gate dielectric 114-1 may be provided by atomic layer deposition (ALD), or any other suitable technique.

Figure 31:
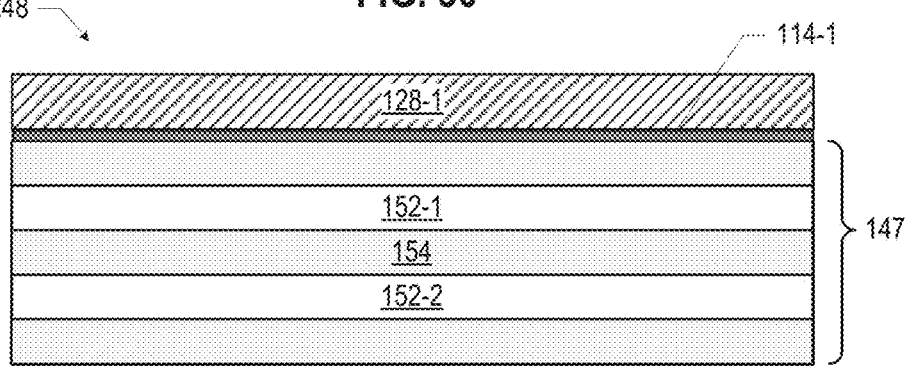

FIG. 31 is a cross-sectional view of an assembly 248 subsequent to providing an insulating material 128-1 on the assembly 246 (FIG. 30). Any suitable material may be used as the insulating material 128-1 to electrically insulate the trenches 107-11 and 107-12 from each other, as discussed above. As noted above, in some embodiments, the insulating material 128-1 may be a dielectric material, such as silicon oxide. In some embodiments, the gate dielectric 114-1 may not be provided on the quantum well stack 147 before the deposition of the insulating material 128-1; instead, the insulating material 128-1 may be provided directly on the quantum well stack 147, and the gate dielectric 114-1 may be provided in trenches 107-1 of the insulating material 128-1 after the trenches 107-1 are formed.

Figure 32:
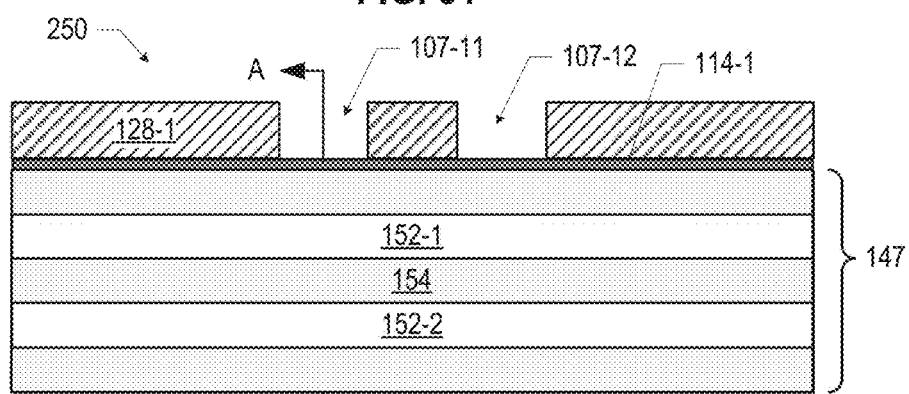
Figure 33:
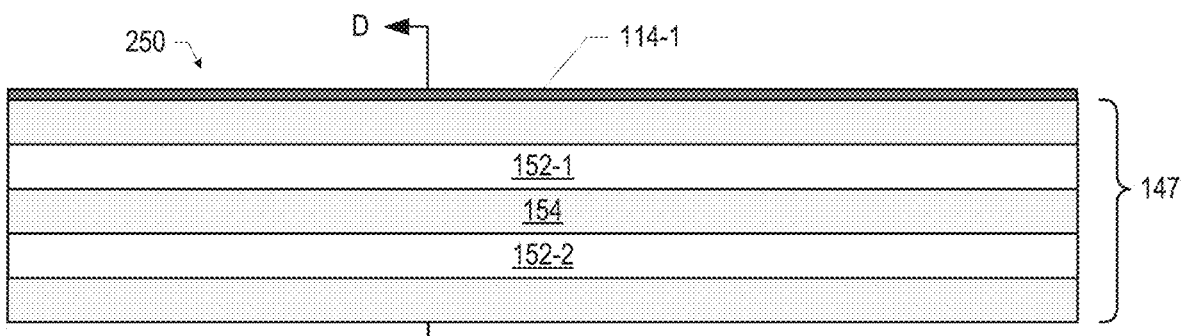
Figure 34:
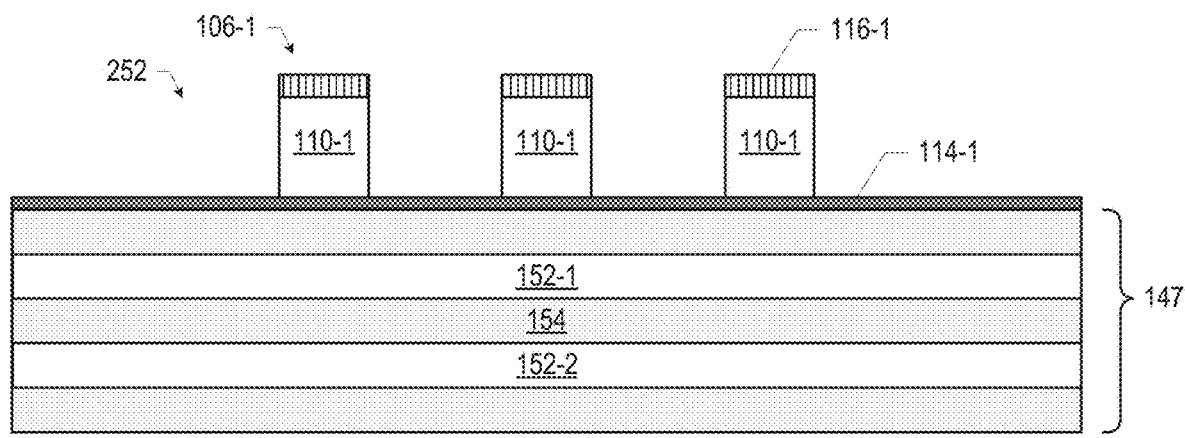
Figure 35:
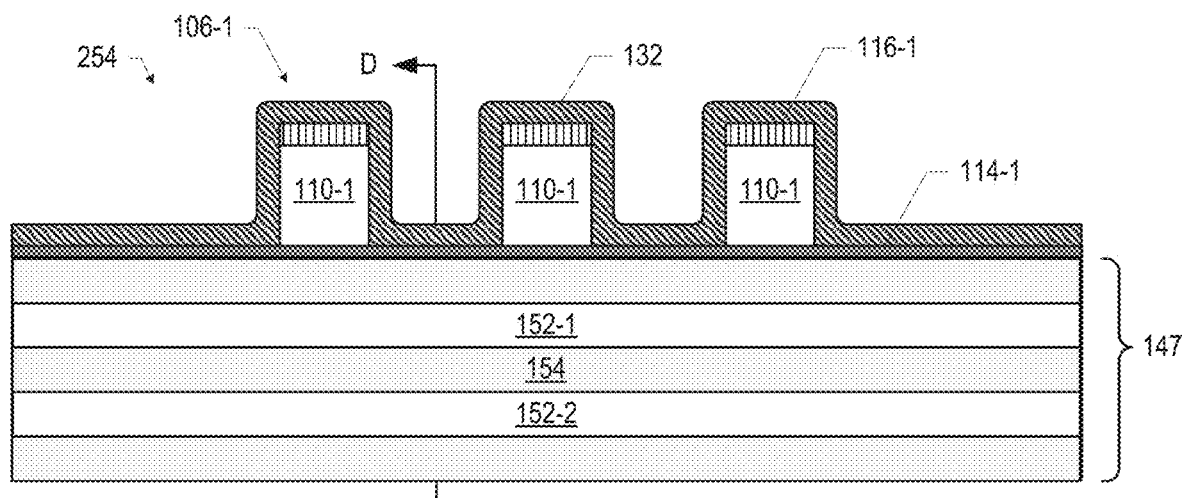

FIG. 32 is a cross-sectional view of an assembly 250 subsequent to forming trenches 107-11 in the insulating material 128-1 of the assembly 248 (FIG. 31). The trenches 107-1 may extend down to the gate dielectric 114-1, and may be formed in the assembly 248 by patterning and then etching the assembly 248 using any suitable conventional lithographic process known in the art. For example, a hardmask may be provided on the insulating material 128-1, and a photoresist may be provided on the hardmask; the photoresist may be patterned to identify the areas in which the trenches 107-1 are to be formed, the hardmask may be etched in accordance with the patterned photoresist, and the insulating material 128-1 may be etched in accordance with the etched hardmask (after which the remaining hardmask and photoresist may be removed). In some embodiments, a combination of dry and wet etch chemistry may be used to form the trenches 107-1 in the insulating material 128-1, and the appropriate chemistry may depend on the materials included in the assembly 208, as known in the art. Although the trenches 107-1 illustrated in FIG. 32 (and other accompanying drawings) are shown as having substantially parallel sidewalls, in some embodiments, the trenches 107-1 may be tapered, narrowing towards the quantum well stack 147. FIG. 33 is a view of the assembly 250 taken along the section A-A of FIG. 32, through a trench 107-1 (while FIG. 32 illustrates the assembly 250 taken along the section D-D of FIG. 33). FIGS. 34-35 maintain the perspective of FIG. 33.

As noted above, in some embodiments, the gate dielectric 114-1 may be provided in the trenches 107-1 (instead of before the insulating material 128-1 is initially deposited, as discussed above with reference to FIG. 30). For example, the gate dielectric 114-1 may be provided in the trenches 107-1 in the manner discussed below with reference to FIG. 47 (e.g., using ALD). In such embodiments, the gate dielectric 114-1 may be disposed at the bottom of the trenches 107-1, and extend up onto the sidewalls of the trenches 107-1.

FIG. 34 is a cross-sectional view of an assembly 252 subsequent to providing a gate metal 110-1 and a hardmask 116-1 on the assembly 250 (FIGS. 32-33), patterning the hardmask 116-1, and etching the gate metal 110-1 that is not protected by the patterned hardmask 116-1 to form the gates 106. The formation of the gates 106-1 in the assembly 252 may take the form of any of the embodiments discussed above with reference to FIGS. 11-13. In some embodiments, as illustrated in FIG. 34, the gate dielectric 114-1 may remain on the quantum well stack 147 after the etched gate metal 110-1 is etched away; in other embodiments, the gate dielectric 114-1 may also be etched during the etching of the gate metal 110-1. Examples of such embodiments are discussed below with reference to FIGS. 55-58.

Figure 36:
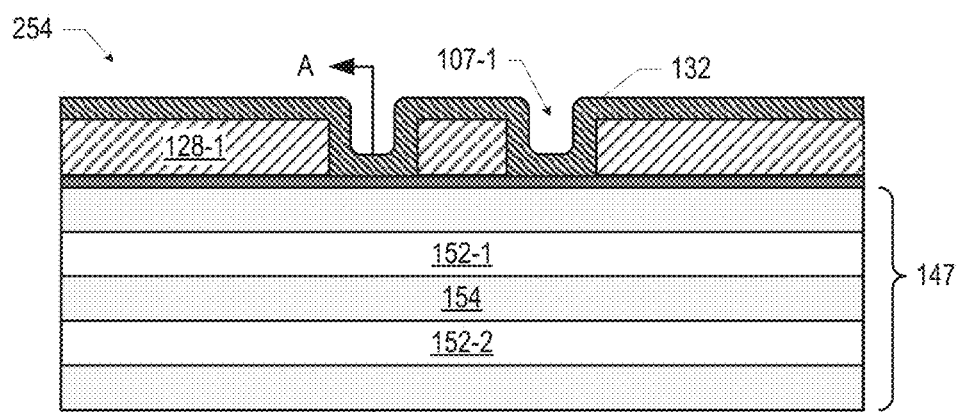

FIG. 35 is a cross-sectional view of an assembly 254 subsequent to providing spacer material 132 on the assembly 252 (FIG. 34). FIG. 36 is a view of the assembly 254 taken along the section D-D of FIG. 35, through the region between adjacent gates 106 (while FIG. 35 illustrates the assembly 254 taken along the section A-A of FIG. 36, along a trench 107-1). The spacer material 132 may include any of the materials discussed above with reference to the spacers 134, for example, and may be deposited using any suitable technique. For example, the spacer material 132 may be a nitride material (e.g., silicon nitride) deposited by chemical vapor deposition (CVD) or atomic layer deposition (ALD). As illustrated in FIGS. 35 and 36, the spacer material 132 may be conformally deposited on the assembly 252.

Figure 37:
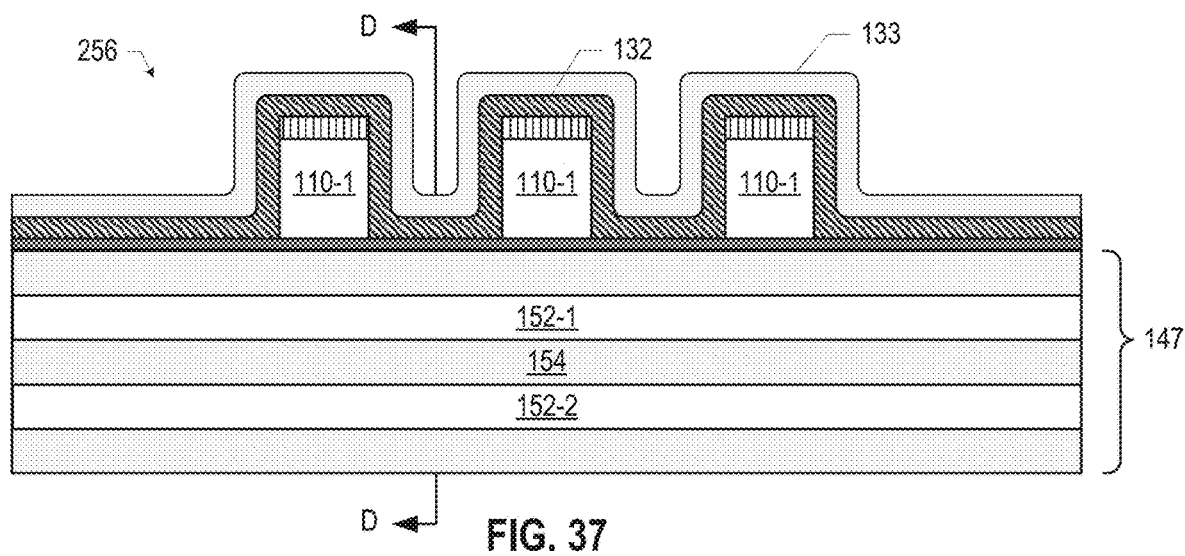
Figure 38:
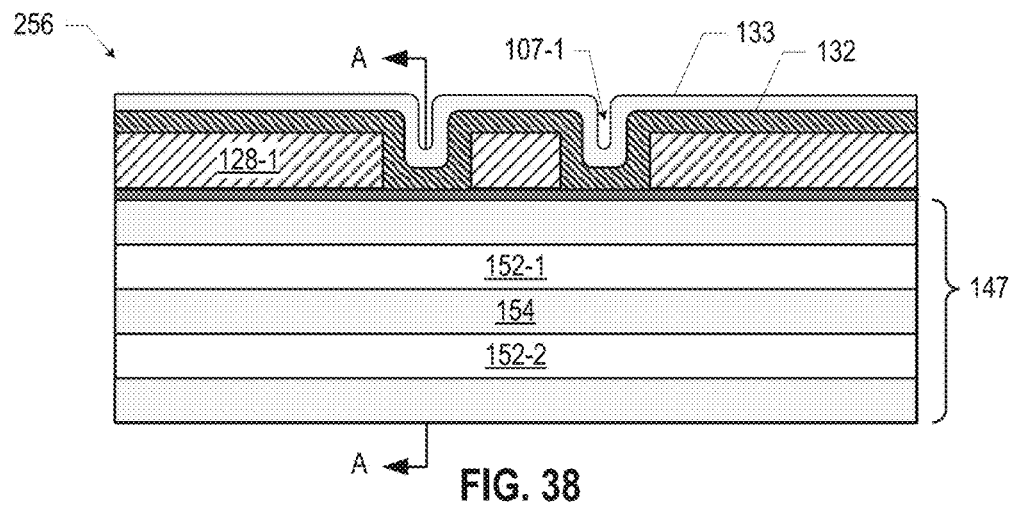

FIG. 37 is a cross-sectional view of an assembly 256 subsequent to providing capping material 133 on the assembly 254 (FIGS. 35 and 36). FIG. 38 is a view of the assembly 256 taken along the section D-D of FIG. 37, through the region between adjacent gates 106 (while FIG. 37 illustrates the assembly 256 taken along the section A-A of FIG. 38, along a trench 107-1). The capping material 133 may be any suitable material; for example, the capping material 133 may be silicon oxide deposited by CVD or ALD. As illustrated in FIGS. 37 and 38, the capping material 133 may be conformally deposited on the assembly 254.

Figure 39:
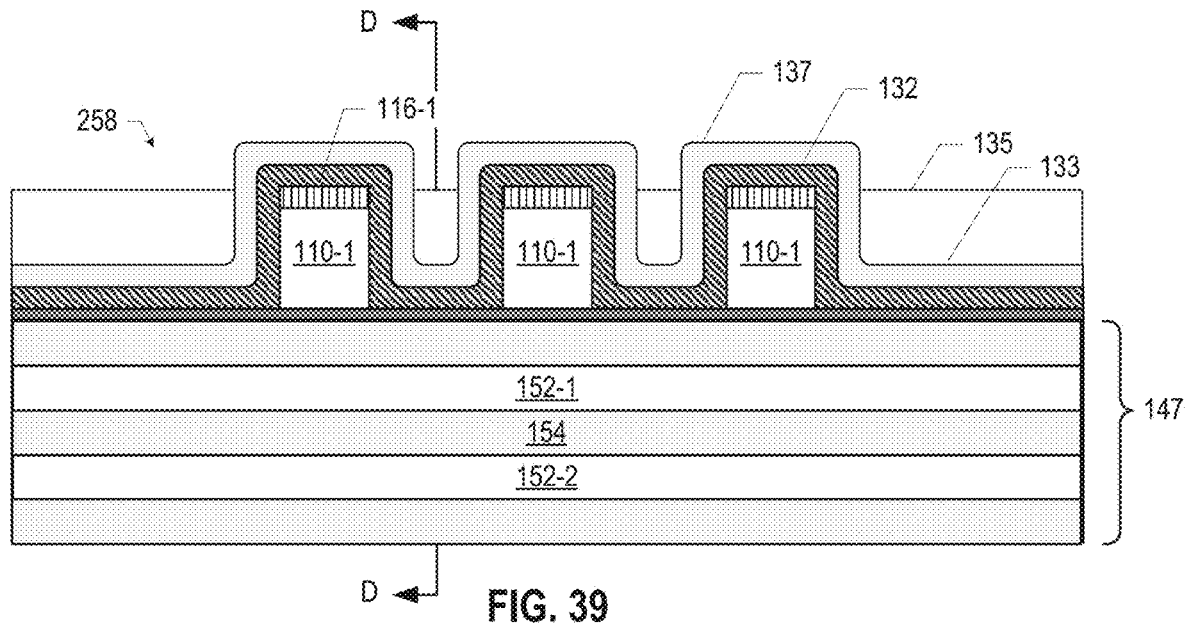
Figure 40:
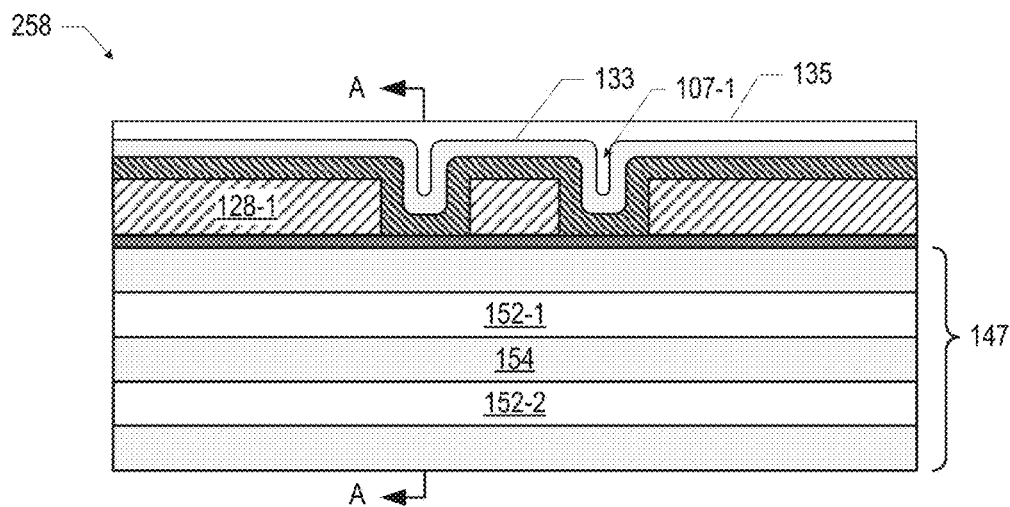

FIG. 39 is a cross-sectional view of an assembly 258 subsequent to providing a sacrificial material 135 on the assembly 256 (FIGS. 37 and 38). FIG. 40 is a view of the assembly 258 taken along the section D-D of FIG. 39, through the region between adjacent gates 106 (while FIG. 39 illustrates the assembly 258 taken along the section A-A of FIG. 40, through a trench 107-1). The sacrificial material 135 may be deposited on the assembly 256 to completely cover the capping material 133, then the sacrificial material 135 may be recessed to expose portions 137 of the capping material 133. In particular, the portions 137 of capping material 133 disposed near the hardmask 116-1 on the gate metal 110-1 may not be covered by the sacrificial material 135. As illustrated in FIG. 40, all of the capping material 133 disposed in the region between adjacent gates 106 may be covered by the sacrificial material 135. The recessing of the sacrificial material 135 may be achieved by any etching technique, such as a dry etch. The sacrificial material 135 may be any suitable material, such as a bottom anti-reflective coating (BARC).

Figure 41:
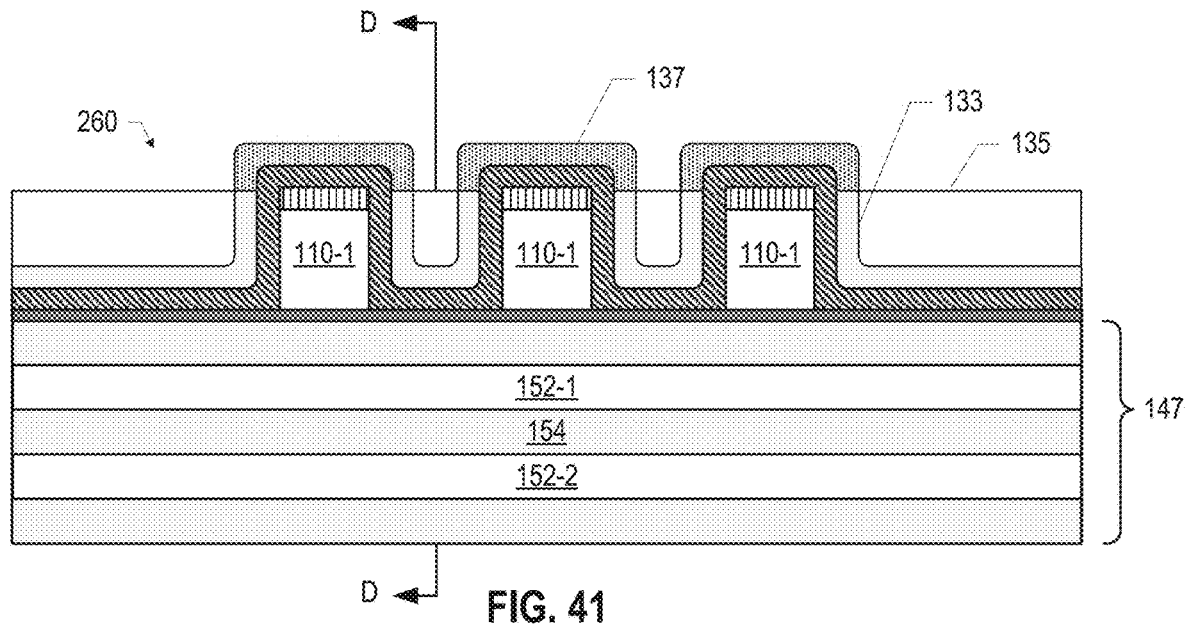
Figure 42:
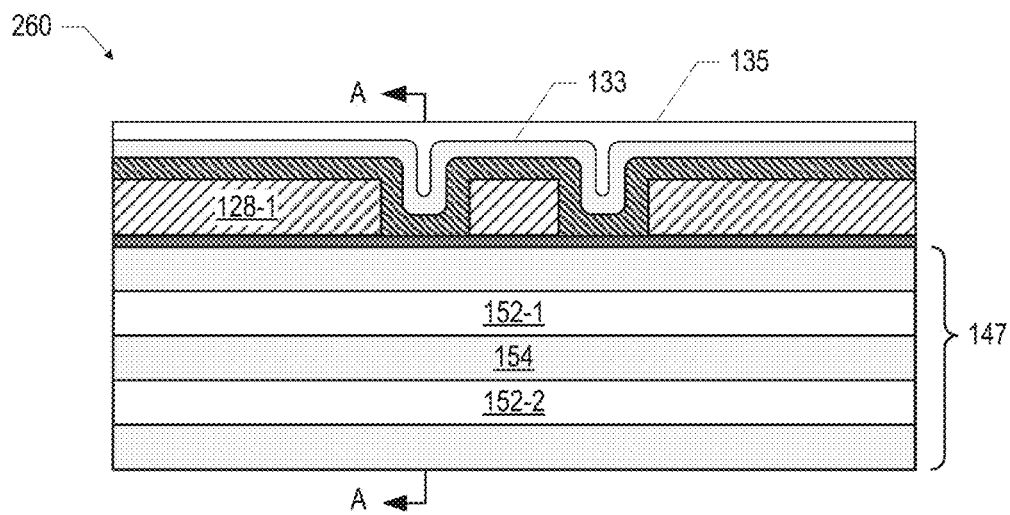

FIG. 41 is a cross-sectional view of an assembly 260 subsequent to treating the exposed portions 137 of the capping material 133 of the assembly 258 (FIGS. 39 and 40) to change the etching characteristics of the exposed portions 137 relative to the rest of the capping material 133. FIG. 42 is a view of the assembly 260 taken along the section D-D of FIG. 41, through the region between adjacent gates 106 (while FIG. 42 illustrates the assembly 260 taken along the section A-A of FIG. 42, through a trench 107-1). In some embodiments, this treatment may include performing a high-dose ion implant in which the implant dose is high enough to cause a compositional change in the portions 137 and achieve a desired change in etching characteristics.

Figure 43:
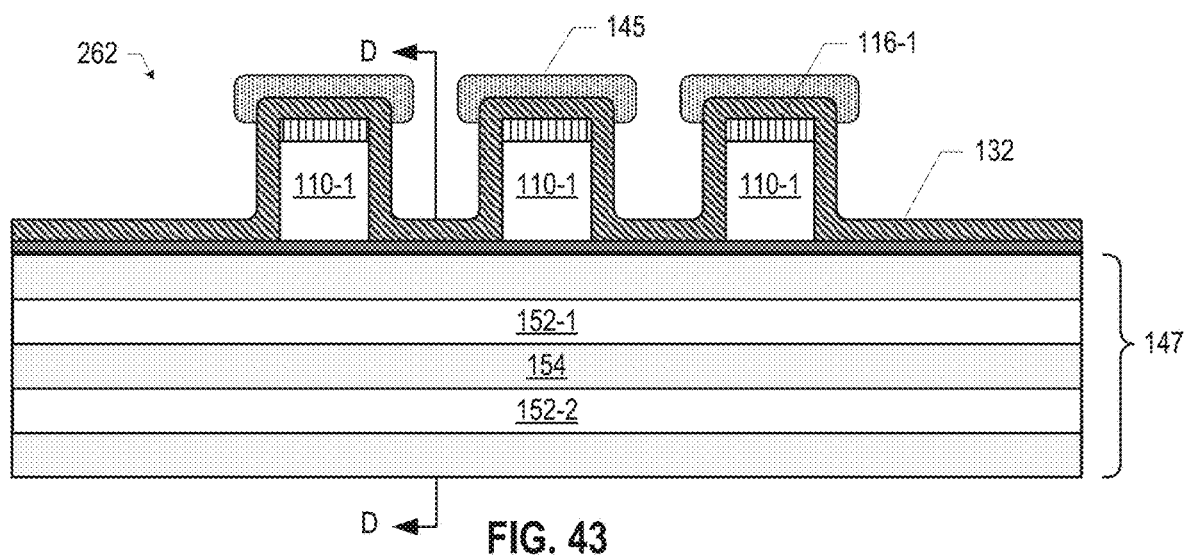
Figure 44:
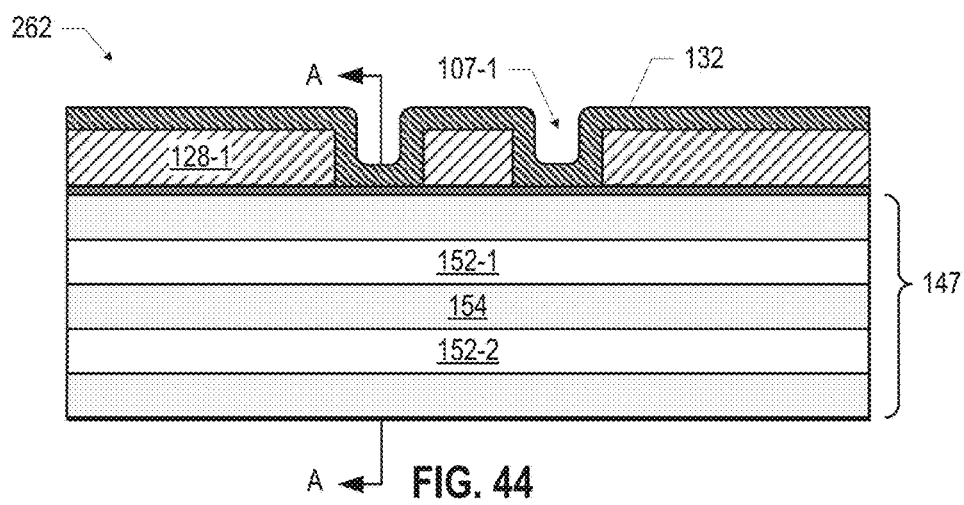

FIG. 43 is a cross-sectional view of an assembly 262 subsequent to removing the sacrificial material 135 and the unexposed capping material 133 of the assembly 260 (FIGS. 41 and 42). FIG. 44 is a view of the assembly 262 taken along the section D-D of FIG. 43, through the region between adjacent gates 106 (while FIG. 43 illustrates the assembly 262 taken along the section A-A of FIG. 44, through a trench 107-1). The sacrificial material 135 may be removed using any suitable technique (e.g., by ashing, followed by a cleaning step), and the untreated capping material 133 may be removed using any suitable technique (e.g., by etching). In embodiments in which the capping material 133 is treated by ion implantation (e.g., as discussed above with reference to FIGS. 41 and 42), a high temperature anneal may be performed to incorporate the implanted ions in the portions 137 of the capping material 133 before removing the untreated capping material 133. The remaining treated capping material 133 in the assembly 262 may provide capping structures 145 disposed proximate to the "tops" of the gates 106-1 and extending over the spacer material 132 disposed on the "sides" of the gates 106-1.

Figure 45:
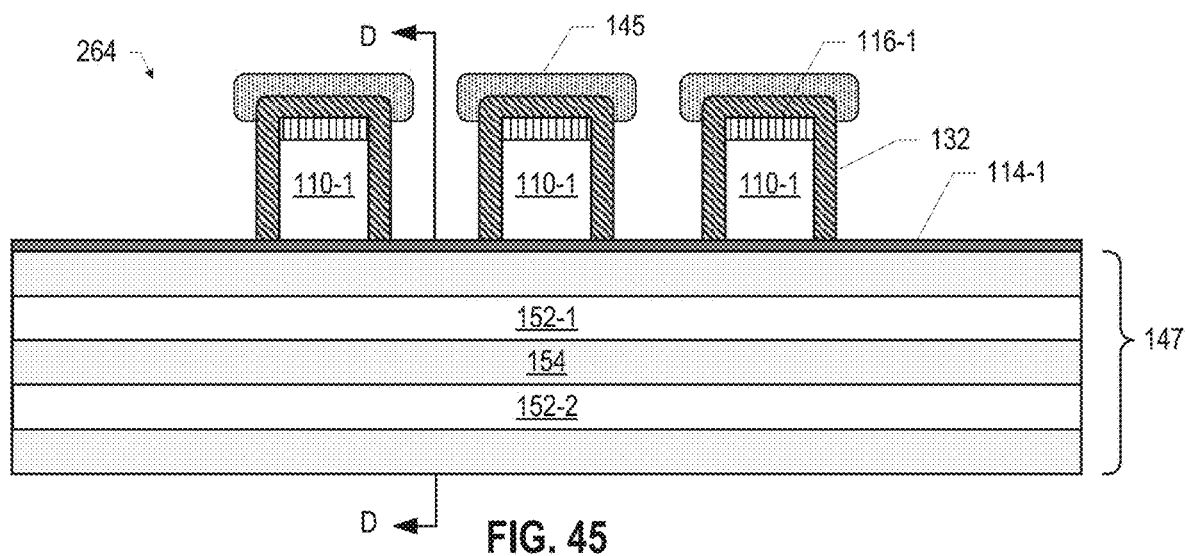
Figure 46:
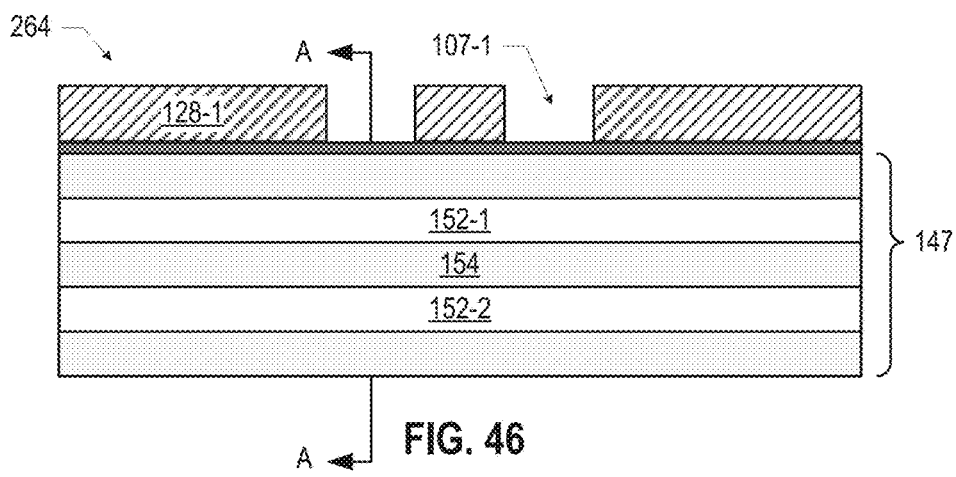
Figure 47:
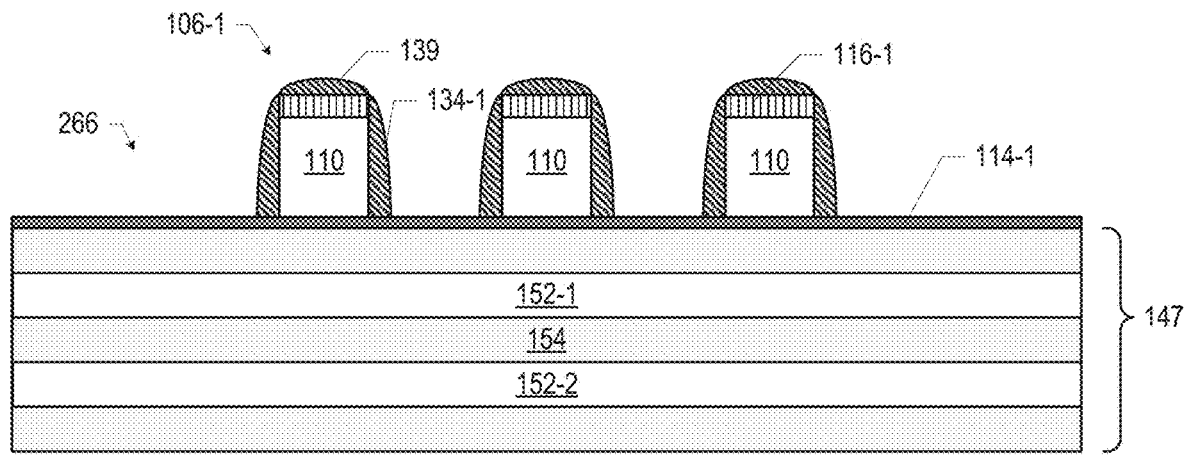
Figure 48:
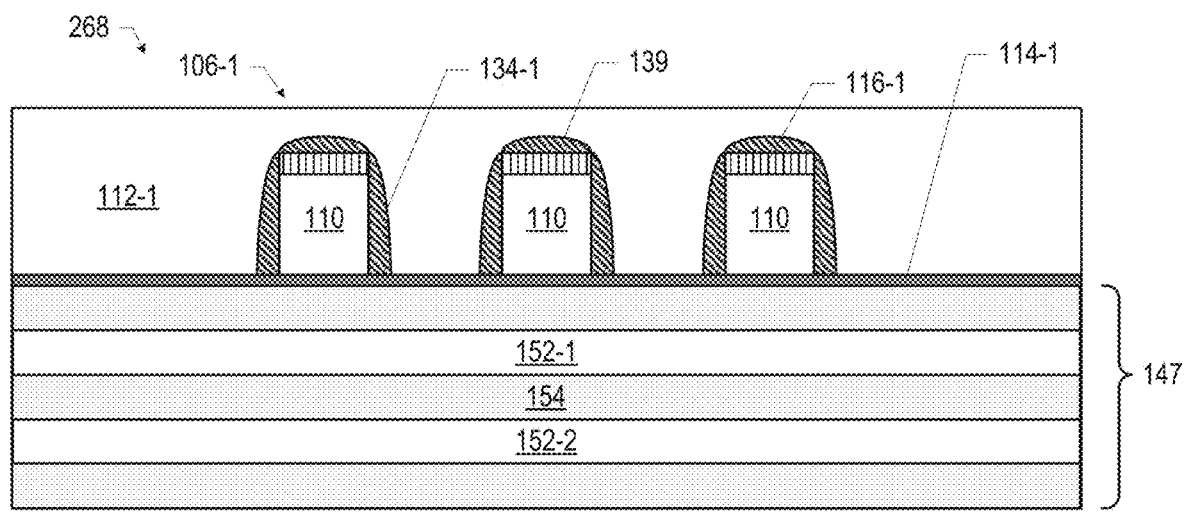
Figure 49:
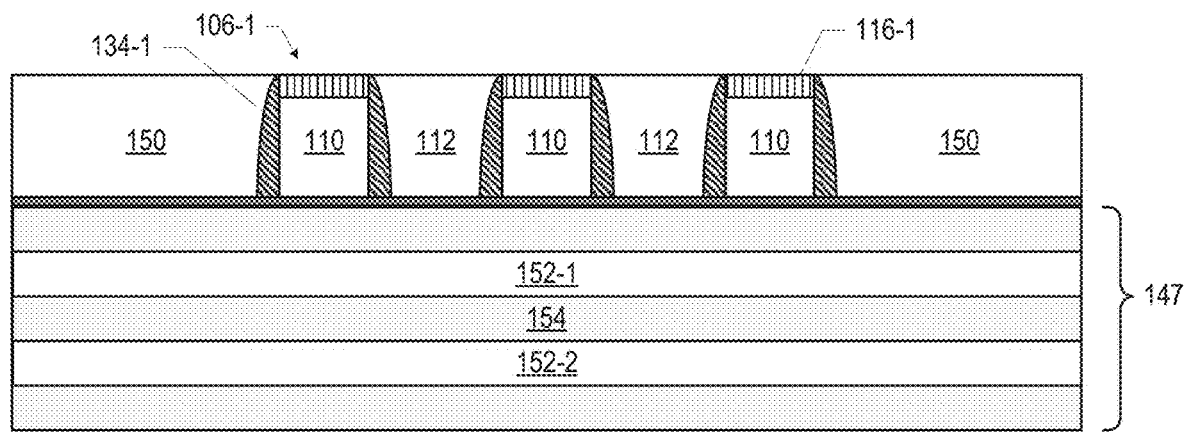

FIG. 45 is a cross-sectional view of an assembly 264 subsequent to directionally etching the spacer material 132 of the assembly 262 (FIGS. 43 and 44) that isn't protected by a capping structure 145, leaving spacer material 132 on the sides and top of the gates 106-1 (e.g., on the sides and top of the hardmask 116-1 and the gate metal 110-1). FIG. 46 is a view of the assembly 264 taken along the section D-D of FIG. 45, through the region between adjacent gates 106 (while FIG. 45 illustrates the assembly 264 taken along the section A-A of FIG. 46, through a trench 107-1). The etching of the spacer material 132 may be an anisotropic etch, etching the spacer material 132 "downward" to remove the spacer material 132 in some of the area between the gates 106-1 (as illustrated in FIGS. 45 and 46), while leaving the spacer material 135 on the sides and tops of the gates 106-1. In some embodiments, the anisotropic etch may be a dry etch. FIGS. 47-49 maintain the cross-sectional perspective of FIG. 45.

FIG. 47 is a cross-sectional view of an assembly 266 subsequent to removing the capping structures 145 from the assembly 264 (FIGS. 45 and 46). The capping structures 145 may be removed using any suitable technique (e.g., a wet etch). The spacer material 132 that remains in the assembly 228 may include spacers 134-1 disposed on the sides of the gates 106-1, and portions 139 disposed on the top of the gates 106-1.

FIG. 48 is a cross-sectional view of an assembly 268 subsequent to providing the gate metal 112-1 on the assembly 266 (FIG. 47). The gate metal 112-1 may fill the areas between adjacent ones of the gates 106-1, and may extend over the tops of the gates 106-1 and over the spacer material portions 139. The gate metal 112-1 of the assembly 268 may fill the trenches 107-1 (between the gates 106-1) and extend over the insulating material 128-1.

FIG. 49 is a cross-sectional view of an assembly 270 subsequent to planarizing the assembly 268 (FIG. 48) to remove the gate metal 112-1 above the gates 106-1, as well as to remove the spacer material portions 139 above the hardmask 116-1. In some embodiments, the assembly 268 may be planarized using a chemical mechanical polishing (CMP) technique. The planarizing of the assembly 268 may also remove some of the hardmask 116-1, in some embodiments. Some of the remaining gate metal 112-1 may fill the areas between adjacent ones of the gates 106-1, while other portions 150 of the remaining gate metal 112-1 may be located "outside" of the gates 106-1. The assembly 270 may be further processed substantially as discussed above with reference to FIGS. 18-29 to form the quantum dot device 100 of FIG. 29, using the operations discussed above with reference to FIGS. 30-49 to form the gates 106-2 and provide the gate metal 112-2 for the gates 108-2.

As discussed above, in the quantum dot device 100 of FIG. 29, there may not be any substantial spacer material between the gate metal 112 and the proximate sidewalls of the trench 104 in the y-direction. In other embodiments, spacers 134 may also be disposed between the gate metal 112 and the sidewalls of the trench 104 in the y-direction. To manufacture such a quantum dot device 100, the operations discussed above with reference to FIGS. 37-46 may not be performed; instead, the spacer material 132 of the assembly 254 of FIGS. 35 and 36 may be anisotropically etched (as discussed with reference to FIGS. 45 and 46) to form the spacers 134-1 on the sides of the gates 106-1 and on the sidewalls of the trench 104. Such an assembly may be further processed as discussed above with reference to FIGS. 48-49 (or other embodiments discussed herein) to form a quantum dot device 100.

Figure 50:
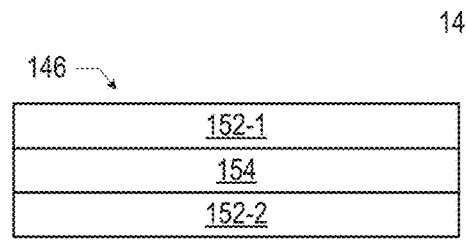
FIGS. 50-51 are cross-sectional views of various examples of quantum well stacks that may be used in a quantum dot device, in accordance with various embodiments.
Figure 51:
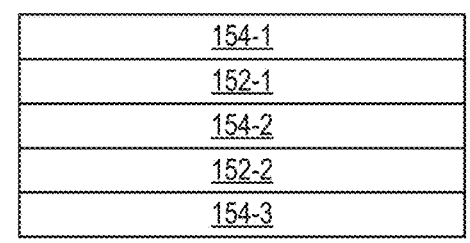

As noted above, a material stack 146 (and thus a quantum well stack 147) formed in the manufacture of a quantum dot device 100 may take any of a number of forms, several of which are illustrated in FIGS. 50-51. In some embodiments, the layers of the material stacks 146 of FIGS. 50 and 51 may be grown on the substrate 144 (and on each other) by epitaxy.

FIG. 50 is a cross-sectional view of a material stack 146 including only a quantum well layer 152-1, a barrier layer 154, and a quantum well layer 152-2. In some embodiments, the quantum well layers 152 of FIG. 50 may be formed of intrinsic silicon, and the gate dielectrics 114 may be formed of silicon oxide; in such an arrangement, during use of the quantum dot device 100, a 2DEG may form in the intrinsic silicon at the interface between the intrinsic silicon and the proximate silicon oxide. Embodiments in which the quantum well layers 152 of FIG. 50 are formed of intrinsic silicon may be particularly advantageous for electron-type quantum dot devices 100. In some embodiments, the quantum well layers 152 of FIG. 50 may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained. During manufacture of the quantum dot device 100, the quantum well layer 152-2 may be polished to a predetermined thickness as part of removal of the support 103 (as discussed above with reference to FIG. 26), and thus an amount of the quantum well layer 152-2 in the material stack 146 may be part of the support 103.

The barrier layer 154 of FIG. 50 may provide a potential barrier between the quantum well layer 152-1 and the quantum well layer 152-2. In some embodiments in which the quantum well layers 152 of FIG. 50 are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the material stack 146 of FIG. 50 may take any suitable values.

For example, in some embodiments, the thickness of the barrier layer 154 (e.g., silicon germanium) may be between 0 and 400 nanometers. In some embodiments, the thickness of the quantum well layers 152 (e.g., silicon or germanium) may be between 5 and 30 nanometers. These thicknesses may represent thicknesses of the layers in the quantum well stack 147, in some embodiments. At least some of the material stack 146 of FIG. 50 may be disposed between the sets of gates 105-1 and 105-2 in the form of the quantum well stack 147, as discussed above.

FIG. 51 is a cross-sectional view of a material stack 146 including quantum well layers 152-1 and 152-2, a barrier layer 154-2 disposed between the quantum well layers 152-1 and 152-2, and additional barrier layers 154-1 and 154-3. In the quantum dot device 100, the barrier layer 154-1 may be disposed between the quantum well layer 152-1 and the gate dielectric 114-1. The barrier layer 154-3 may be disposed between the quantum well layer 152-2 and the gate dielectric 114-2. In some embodiments, the barrier layer 154-3 may be formed of a material (e.g., silicon germanium), and when the material stack 146 is being grown on the substrate 144, the barrier layer 154-3 may include a buffer region of that material. This buffer region may trap defects that form in this material as it is grown on the substrate 144, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. When the support 103 is separated from the rest of the assembly 238 during manufacturing of the quantum dot device 100 (e.g., as discussed above with reference to FIG. 26), the material stack 146 may be "broken" in a buffer region of the barrier layer 154-3. For example, during manufacture of the quantum dot device 100, the barrier layer 154-1 may be polished to a predetermined thickness as part of removal of the support 103 (as discussed above with reference to FIG. 26), and thus an amount of the barrier layer 154-3 in the material stack 146 may be part of the support 103.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. In some embodiments, the barrier layer 154-1 may have a similar form as the barrier layer 154-3, but may not include a "buffer region" as discussed above; in the quantum dot device 100, the barrier layer 154-3 and the barrier layer 154-1 may have substantially the same structure. The barrier layer 154-2 may take the form of any of the embodiments of the barrier layer 154 discussed above with reference to FIG. 50. The thicknesses (i.e., z-heights) of the layers in the material stack 146 of FIG. 33 may take any suitable values. For example, in some embodiments, the thickness of the barrier layers 154-1 and 154-3 (e.g., silicon germanium) in the quantum dot device 100 may be between 0 and 400 nanometers. In some embodiments, the thickness of the quantum well layers 152 (e.g., silicon or germanium) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

Although the fins 104 have been illustrated in many of the preceding figures as substantially rectangular with parallel sidewalls, this is simply for ease of illustration, and the fins 104 may have any suitable shape (e.g., a shape appropriate to the manufacturing processes used to form the fins 104). For example, in some embodiments, the fins 104 may be tapered, narrowing as they extend away from the base 102 (FIG. 6). In some embodiments, the fins 104 may taper by 3-10 nanometers in x-width for every 100 nanometers in z-height (e.g., 5 nanometers in x-width for every 100 nanometers in z-height).

Figure 52:
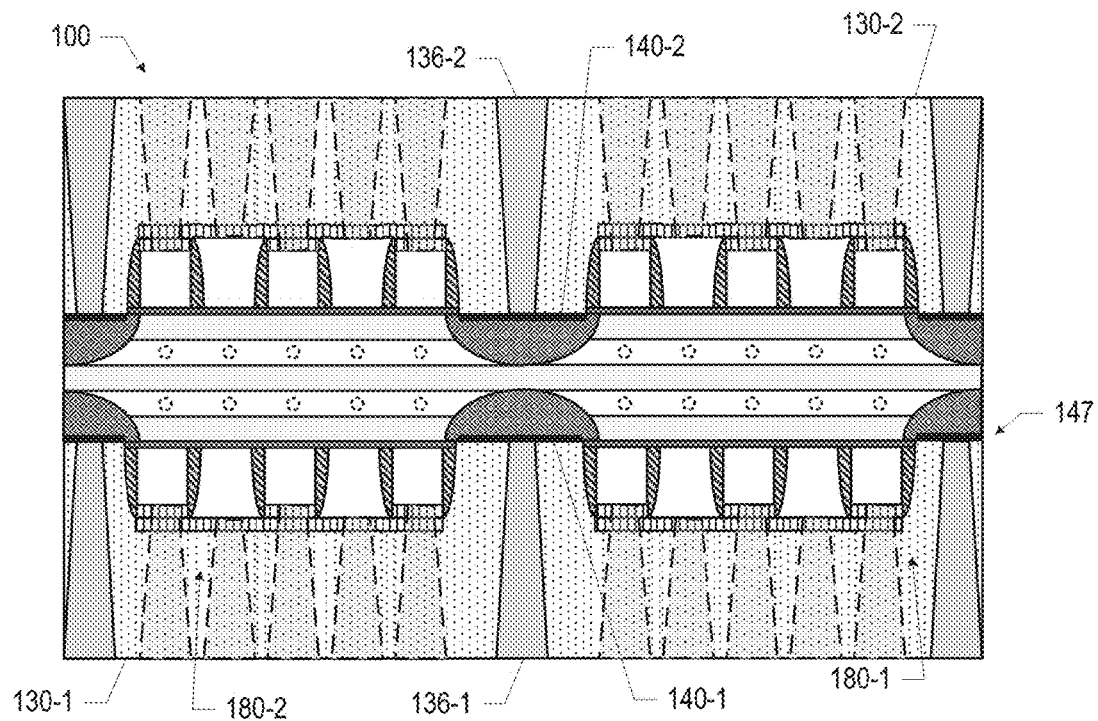
FIG. 52 illustrates an embodiment of a quantum dot device having multiple groups of gates on a single quantum well stack, in accordance with various embodiments.

As noted above, a single fin 104 or trench 107 may include multiple groups of the sets of gates 105-1 and 105-2, spaced apart along the fin 104 or trench 107. FIG. 52 is a cross-sectional view of an example of such a quantum dot device 100 (taken from the perspective of FIG. 2) having multiple groups of sets of gates 180 on a single fin 104 or in a single trench 107, in accordance with various embodiments. Each of the groups 180 may include a set of gates 105-1 and a set of gates 105-2 (not labeled in FIG. 52 for ease of illustration) that may take the form of any of the embodiments of the sets of gates 105-1 and 105-2 discussed herein. A doped region 140-1 (and its interface material 141-1) may be disposed between the sets of gates 105-1 of two adjacent groups 180 (labeled in FIG. 52 as groups 180-1 and 180-2), and may provide a common reservoir for the sets of gates 105-1 of both groups 180. In some embodiments, this "common" doped region 140-1 may be electrically contacted by a single conductive via 136-1. Similarly, a common doped region 140-2 may be disposed between the sets of gates 105-2 of two adjacent groups 180. The particular number of gates 106/108 illustrated in FIG. 52, and the particular number of groups 180, is simply illustrative, and a fin 104 or trench 107 may include any suitable number of gates 106/108 arranged in any suitable number of groups 180.

Figure 53:
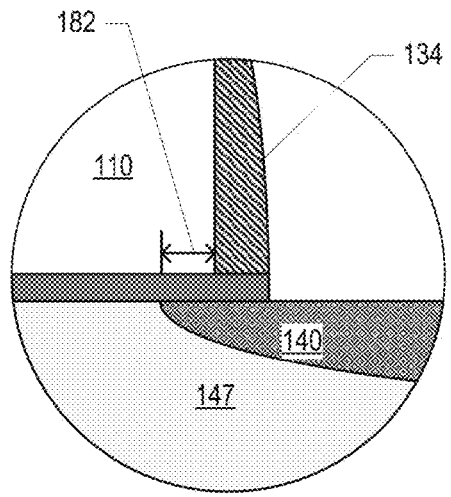
FIGS. 53-54 illustrate detail views of various embodiments of a doped region in a quantum dot device.
Figure 54:
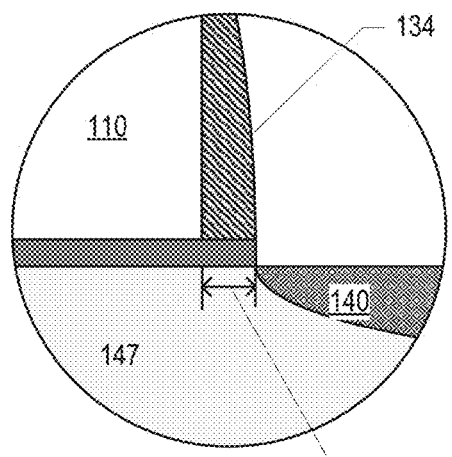

As discussed above, the outer spacers 134 on the outer gates 106 of a set of gates 105 may provide a doping boundary, limiting diffusion of the dopant from the doped regions 140 into the area under the proximate gates 106/108. In some embodiments, the doped regions 140 may extend past the outer spacers 134 and under the outer gates 106. For example, as illustrated in FIG. 53, the doped region 140 may extend past the outer spacers 134 and under the outer gates 106 by a distance 182 between 0 and 10 nanometers. In some embodiments, the doped regions 140 may not extend past the outer spacers 134 toward the outer gates 106, but may instead "terminate" under the outer spacers 134. For example, as illustrated in FIG. 54, the doped regions 140 may be spaced away from the interface between the outer spacers 134 and the outer gates 106 by a distance 184 between 0 and 10 nanometers. The interface material 141 is omitted from FIGS. 53 and 54 for ease of illustration.

As discussed above, in some embodiments in which the gate dielectric 114 is not a layer shared commonly between the gates 108 and 106, but instead is separately deposited on the quantum well stack 147 between the spacers 134, the gate dielectric 114 may extend at least partially up the sides of the spacers 134, and the gate metal 112 may extend between the portions of gate dielectric 114 on the spacers 134. FIGS. 55-58 illustrate various alternative stages in the manufacture of such an embodiment of a quantum dot device 100, in accordance with various embodiments. In particular, the operations illustrated in FIGS. 55-58 may take the place of the operations illustrated in FIGS. 13-16 with reference to the formation of the gates 106-1/108-1, but the same stages may be used to form the gates 106-2/108-2 instead of or in addition to the gates 106-1/108-1. The support 103 is omitted from FIGS. 55-58 for economy of illustration, and operations are shown as performed on the quantum well stack 147.

Figure 55:
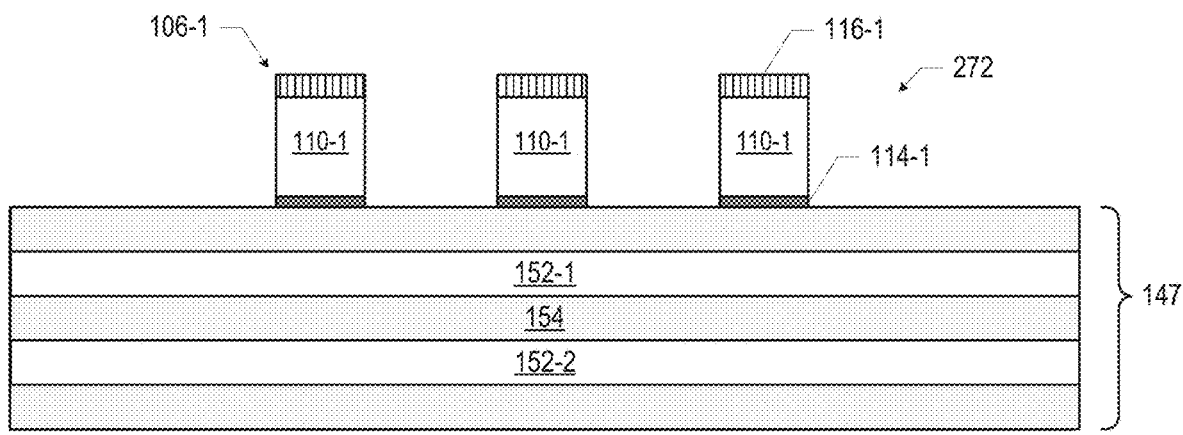
FIGS. 55-58 illustrate various alternative stages in the manufacture of a quantum dot device, in accordance with various embodiments.

FIG. 55 is a cross-sectional view of an assembly 272 subsequent to etching the assembly 212 (FIG. 12) to remove the gate metal 110-1, and the gate dielectric 114-1 that is not protected by the patterned hardmask 116-1, to form the gates 106-1.

Figure 56:
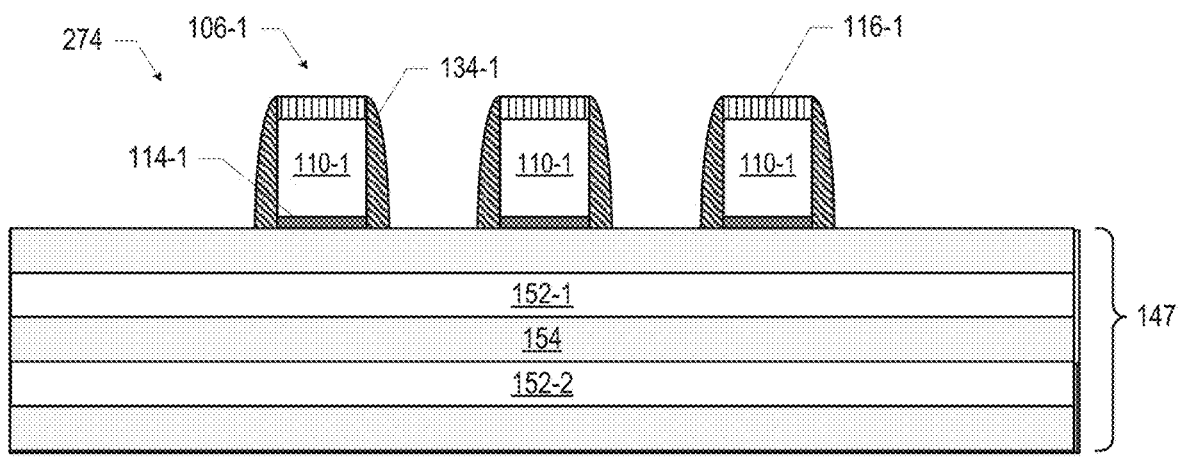

FIG. 56 is a cross-sectional view of an assembly 274 subsequent to forming spacers 134 on the assembly 272 (FIG. 55). The formation of the spacer 134 may take any of the forms discussed above, for example.

Figure 57:
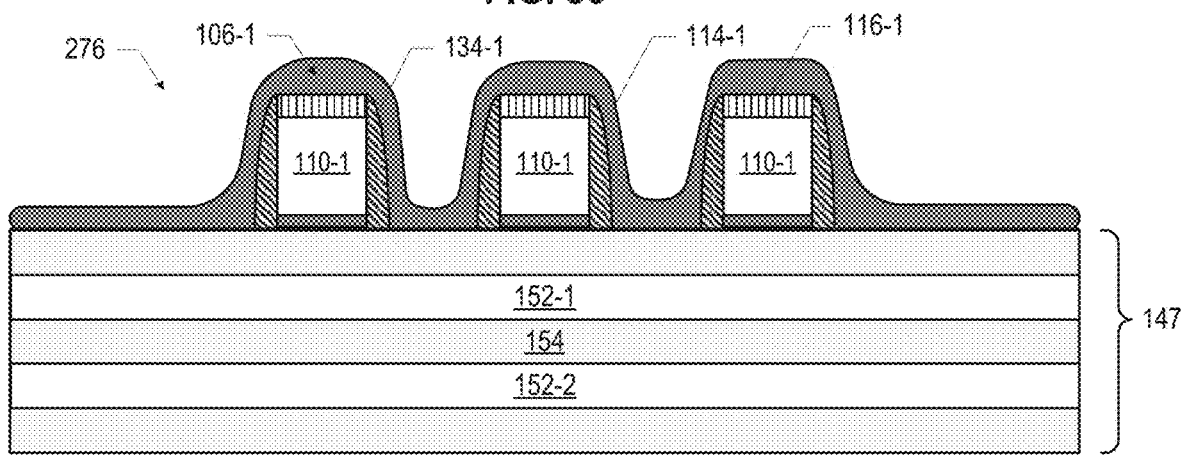

FIG. 57 is a cross-sectional view of an assembly 276 subsequent to providing a gate dielectric 114-1 on the quantum well stack 147 between the gates 106-1 of the assembly 274 (FIG. 56). In some embodiments, the gate dielectric 114-1 provided between the gates 106-1 of the assembly 274 may be formed by atomic layer deposition (ALD) and, as illustrated in FIG. 57, may cover the exposed quantum well stack 147 between the gates 106-1, and may extend onto the adjacent spacers 134-1.

Figure 58:
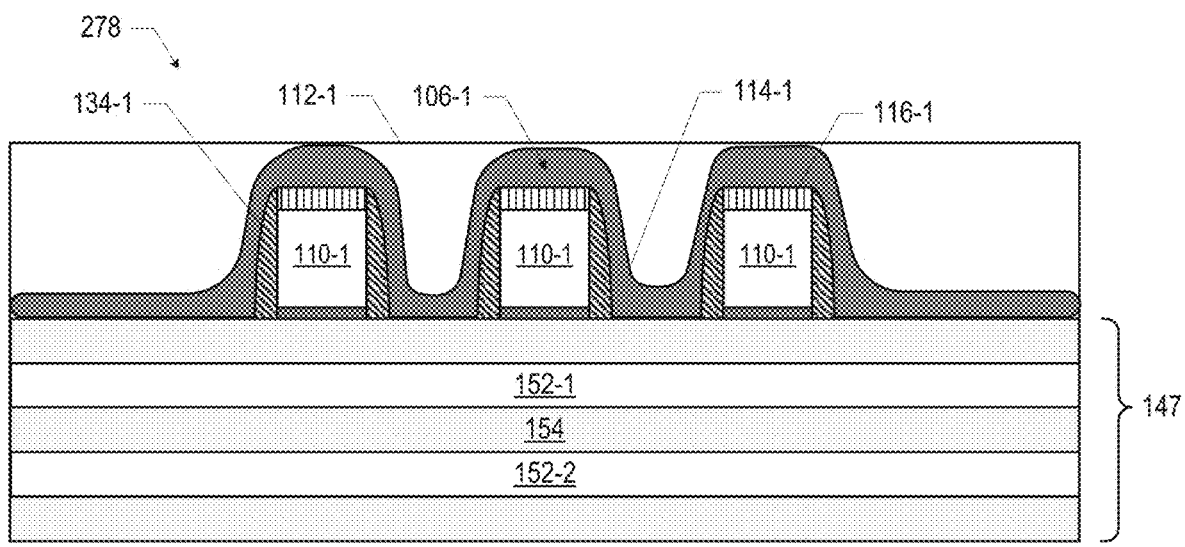

FIG. 58 is a cross-sectional view of an assembly 278 subsequent to providing the gate metal 112-1 on the assembly 276 (FIG. 57). The gate metal 112-1 may fill the areas between adjacent ones of the gates 106-1, and may extend over the tops of the gates 106-1, as shown. The provision of the gate metal 112-1 may take any of the forms discussed above for example. The assembly 278 may be further processed as discussed above with reference to FIGS. 17-28 (or in accordance with any of the other embodiments disclosed herein).

Figure 59:
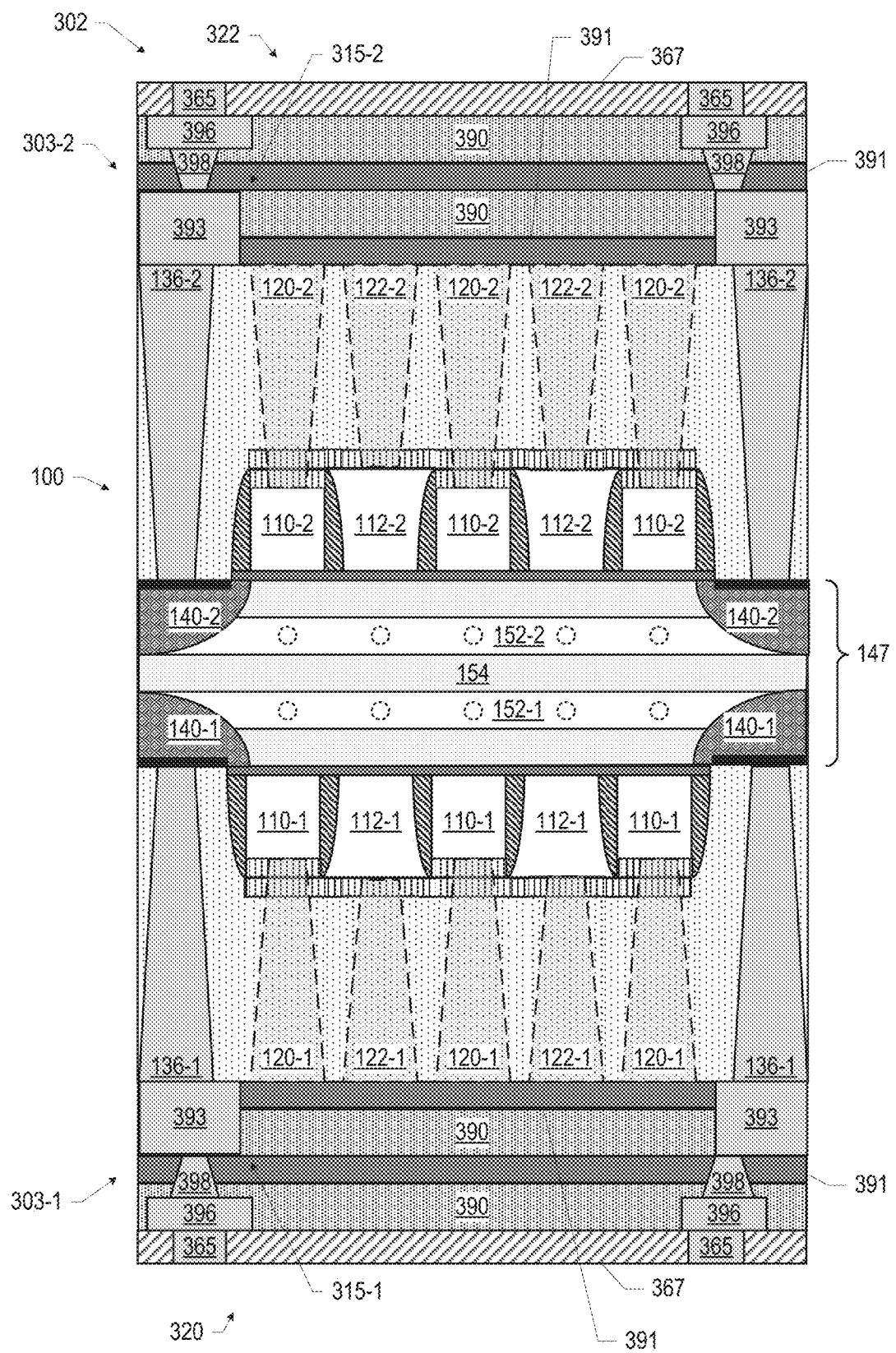
FIG. 59 is a cross-sectional view of a quantum dot device with multiple interconnect layers, in accordance with various embodiments.
Figure 60:
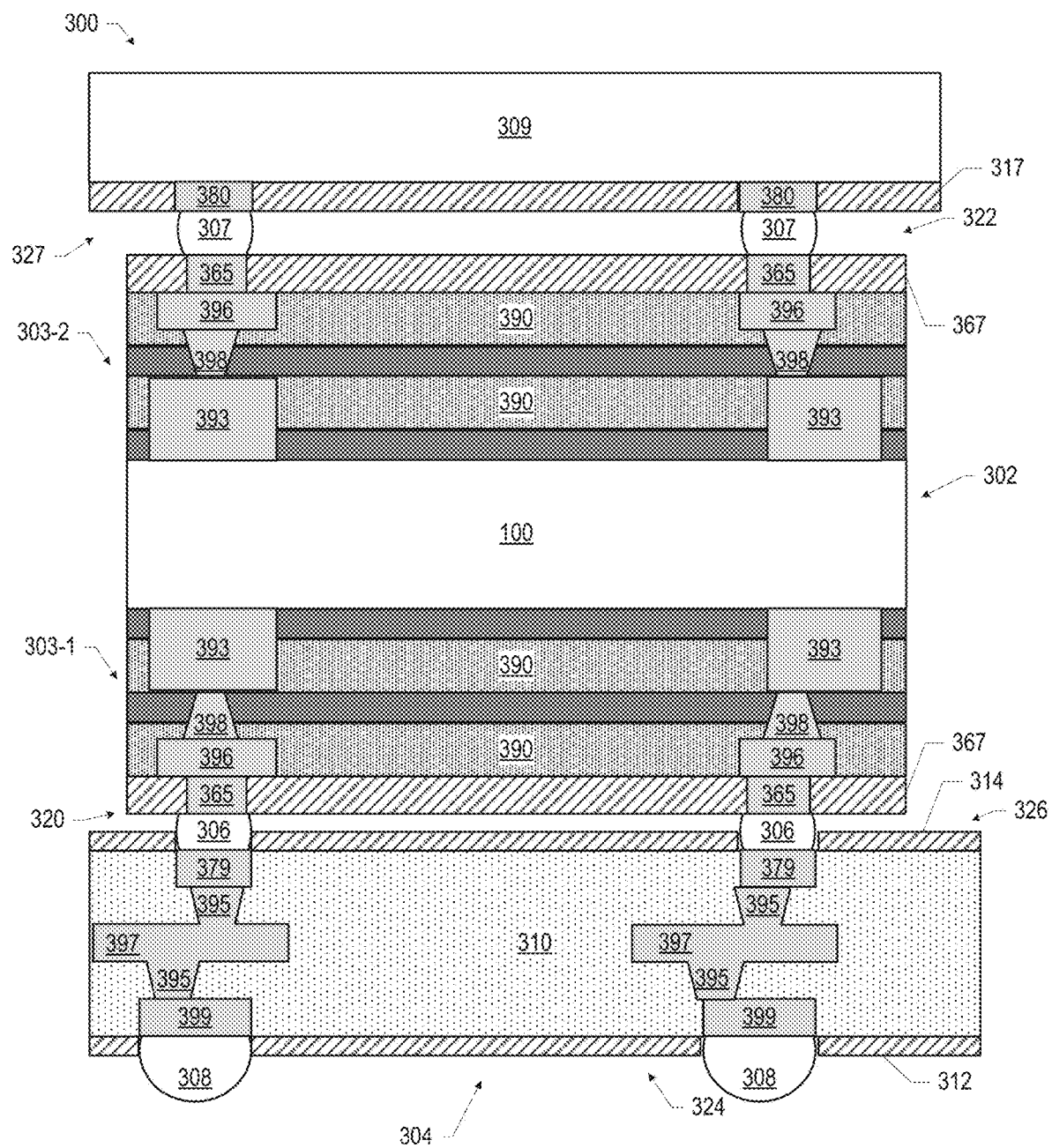
FIG. 60 is a cross-sectional view of a quantum dot device package, in accordance with various embodiments.

In some embodiments, a quantum dot device 100 may be included in a die and coupled to a package substrate to form a quantum dot device package. For example, FIG. 59 is a side cross-sectional view of a die 302 including the quantum dot device 100 cross section of FIG. 2 and conductive pathway layers 303 disposed thereon, while FIG. 60 is a side cross-sectional view of a quantum dot device package 300 in which the die 302 is coupled to a package substrate 304 and another die 309. Details of the quantum dot device 100 are omitted from FIG. 60 for economy of illustration. As noted above, the particular quantum dot device 100 illustrated in FIGS. 59 and 60 may take the form of any of the quantum dot devices 100 disclosed herein, and any of the quantum dot devices 100 disclosed herein may be included in a die (e.g., the die 302) and coupled to a package substrate (e.g., the package substrate 304). In particular, any number of gates 106/108, doped regions 140, and other components discussed herein with reference to various embodiments of the quantum dot device 100 may be included in the die 302.

The die 302 may include a first face 320 and an opposing second face 322. Conductive pathways 315-1 from various components of the quantum dot device 100 may extend to conductive contacts 365 disposed at the first face 320. The conductive pathways 315-1 may include conductive vias, conductive lines, and/or any combination of conductive vias and lines extending from the gate 106-1/108-1 and the doped regions 140-1, for example. For example, FIG. 59 illustrates an embodiment in which a conductive pathway 315-1 (extending between a doped region 140-1 and associated conductive contact 365 disposed at the first face 320) includes a conductive via 136-1, a conductive line 393, a conductive via 398, and a conductive line 396. Conductive pathways 315-2 from various components of the quantum dot device 100 may extend to conductive contacts 365 disposed at the second face 322. The conductive pathways 315-2 may include conductive vias, conductive lines, and/or any combination of conductive vias and lines extending from the gate 106-2/108-2 and the doped regions 140-2, for example. For example, FIG. 59 illustrates an embodiment in which a conductive pathway 315-2 (extending between a doped region 140-2 and associated conductive contact 365 disposed at the second face 322) includes a conductive via 136-2, a conductive line 393, a conductive via 398, and a conductive line 396.

More or fewer structures may be included in the conductive pathways 315, and analogous conductive pathways 315 may be provided between ones of the conductive contacts 365 and the gates 106/108 (and any other components included in the quantum dot device 100). In some embodiments, conductive lines of the die 302 (and the package substrate 304 and the die 309, discussed below) may extend into and out of the plane of the drawing, providing conductive pathways to route electrical signals to and/or from various elements in the die 302. Conductive contacts 365 at the first face 320 and the second face 322 of the die 302 may make the die 302 a "double-sided" die. In some embodiments, the conductive pathways 315-1 disposed between components proximate to the first face 117-1 of the quantum dot device 100 and the conductive contacts 365 at the first face 320 of the die 302 may be arranged in a mirror image arrangement with reference to the conductive pathways 315-2 disposed between components proximate to the second face 117-2 of the quantum dot device 100 and the conductive contacts 365 at the second face 322 of the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 108, the doped regions 140, and the quantum well stack 147 (as well as the proximate conductive vias/lines) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer.

A solder resist material 367 may be disposed around the conductive contacts 365, and in some embodiments may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 59 take the form of bond pads, but other first level interconnect structures may be used (e.g., posts) to route electrical signals to/from the die 302, as discussed below.

The combination of the conductive pathways and the proximate insulating material (e.g., the insulating material 130, the oxide material 390, and the nitride material 391) in the die 302 may provide an interlayer dielectric (ILD) stack of the die 302. The die 302 of FIG. 59 may include two ILD stacks, as shown. As noted above, interconnect structures may be arranged within the quantum dot device 100 to route electrical signals according to a wide variety of designs (in particular, the arrangement is not limited to the particular configuration of interconnect structures depicted in FIG. 59 or any of the other accompanying figures, and may include more or fewer interconnect structures). During operation of the quantum dot device 100, electrical signals (such as power and/or input/output (I/O) signals) may be routed to and/or from the gates 108 and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313 (discussed below) and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 365, 379, and/or 399 may include aluminum, and the first level interconnects 306 and/or the second level interconnects 308 may include an indium-based solder.

In the quantum dot device package 300 (FIG. 60), first level interconnects 306 may be disposed between the first face 320 of the die 302 and the second face 326 of a package substrate 304. First level interconnects 307 may also be disposed between the second face 322 of the die 302 and the first face 327 of a die 309. Having first level interconnects 306/307 disposed between the die 302 and the package substrate 304/die 309 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304, e.g., are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first level interconnects 306/307 may enable the quantum dot device package 300 to have much lower parasitic inductance relative to using wirebonds to couple the die 302 and the package substrate 304 (and/or the die 302 and the die 309), which may result in an improvement in signal integrity for high-speed signals communicated between the die 302 and the package substrate 304/die 309.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulating material 130 disclosed herein, for example. The conductive pathways 313 may include one or more conductive vias 395 and/or one or more conductive lines 397, for example.

The die 309 may include a first face 327 at which conductive contacts 380 are disposed. Solder resist material 317 may be disposed around the conductive contacts 380; the solder resist material 317 may take any of the forms discussed above. In some embodiments, the solder resist material 317 may be omitted. The die 309 may include any desired active or passive electronics, or may itself be an interposer or other component.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 365 of the die 302 may be electrically coupled to the conductive contacts 379 of the package substrate 304 via the first level interconnects 306.

In some embodiments, the first level interconnects 306 may include solder bumps or balls (as illustrated in FIG. 60); for example, the first level interconnects 306 may be flip chip (or controlled collapse chip connection, "C4") bumps disposed initially on the die 302 or on the package substrate 304. The first level interconnects 307 may take any of the forms described herein with reference to the first level interconnects 306. Second level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the quantum dot device package 300 are discussed below with reference to FIG. 62. The die 302 may be brought in contact with the package substrate 304 using a pick-and-place apparatus, for example, and a reflow or thermal compression bonding operation may be used to couple the die 302 to the package substrate 304 via the first level interconnects 306. Similar techniques may be used to bond the die 309 to the die 302.

The conductive contacts 365, 379, 380, and/or 399 may include multiple layers of material that may be selected to serve different purposes. In some embodiments, the conductive contacts 365, 379, 380, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 379, 380, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first level interconnects 306/307 include solder, the solder may be a low-temperature solder (e.g., a solder having a melting point below 100 degrees Celsius) so that it can be melted to couple the conductive contacts 365 and the conductive contacts 379/380 without having to expose the die 302 to higher temperatures and risk damaging the quantum dot device 100. Examples of solders that may be suitable include indium-based solders (e.g., solders including indium alloys). When low-temperature solders are used, however, these solders may not be fully solid during handling of the quantum dot device package 300 (e.g., at room temperature or temperatures between room temperature and 100 degrees Celsius), and thus the solder of the first level interconnects 306/307 alone may not reliably mechanically couple the die 302 and the package substrate 304/die 309 (and thus may not reliably electrically couple the die 302 and the package substrate 304/die 309). In some such embodiments, the quantum dot device package 300 may further include a mechanical stabilizer to maintain mechanical coupling between the die 302 and the package substrate 304/die 309, even when solder of the first level interconnects 306/307 is not solid. Examples of mechanical stabilizers may include an underfill material disposed between the die 302 and the package substrate 304/die 309, a corner glue disposed between the die 302 and the package substrate 304/die 309, an overmold material disposed around the die 302 on the package substrate 304/die 309, and/or a mechanical frame to secure the die 302 and the package substrate 304/die 309.

FIGS. 61A-B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 65) or other logic that is configured to store information in the memory devices or execute instructions stored in the memory array. The dies 452 may take the form of the die 300, for example.

FIG. 62 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442. Any of the components of the device assembly 400 may include a double-sided die 302 or double-sided quantum dot device package 300, as appropriate, even if illustrated as "single-sided" in FIG. 62.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 62 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 60), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 62, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 62, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package 300 or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 62 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. In some embodiments, the package 426 may include the double-sided die 302 and the substrate 304; the package 432 may couple to the other side of the die 302. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections).

As noted above, any suitable techniques may be used to manufacture the quantum dot devices 100 disclosed herein. FIG. 63 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum well stack may be provided. The quantum well stack may include first and second quantum well layers spaced apart by a barrier layer. For example, a material stack 146 may be formed by epitaxy on the substrate 144; the material stack 146 may include a quantum well stack 147 having quantum well layers 152-1 and 152-2 spaced apart by a barrier layer 154 (e.g., as discussed above with reference to FIGS. 4-5 and 50-51).

At 1004, first gates may be formed above a first face of the quantum well stack, proximate to the first quantum well layer. For example, gates 106-1 and 108-1 may be formed proximate to the quantum well layer 152-1 (e.g., as discussed above with reference to FIGS. 11-20 and 30-49).

At 1006, second gates may be formed above a second face of the quantum well stack. The second face may be opposite to the first face, and proximate to the second quantum well layer. For example, gates 106-2 and 108-2 may be formed proximate to the quantum well layer 152-2 (e.g., as discussed above with reference to FIG. 28).

At 1008, a first set of conductive pathways may be formed between the first gates and a first face of the quantum dot device. For example, the conductive vias 120-1/122-1/136-1 may be formed between the gates 106-1/108-1 and the first face 117-1 (e.g., as discussed above with reference to FIG. 25).

At 1010, a second set of conductive pathways may be formed between the second gates and a second face of the quantum dot device. For example, the conductive vias 120-2/122-2/136-2 may be formed between the gates 106-2/108-2 and the second face 117-2 (e.g., as discussed above with reference to FIG. 28).

A number of techniques are disclosed herein for operating a quantum dot device 100. FIG. 64 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

At 1022, electrical signals may be applied through a first set of conductive pathways to a first set of gates disposed proximate to a first face of a quantum well stack to cause a first quantum dot to form in a first quantum well layer in the quantum well stack under the first set of gates. For example, one or more voltages may be applied through the conductive vias 120-1/122-1 to the gates 106-1/108-1 (part of conductive pathways that extend to the first face 117-1) on a quantum well stack 147 to cause at least one quantum dot 142-1 to form in the quantum well layer 152-1.

At 1024, electrical signals may be applied through a second set of conductive pathways to a second set of gates disposed proximate to a second face of the quantum well stack to cause a second quantum dot to form in a second quantum well layer in the quantum well stack under the second set of gates. The first set of conductive pathways may extend between a first face of the quantum dot device and the first set of gates, the second set of conductive pathways may extend between a second face of the quantum dot device and the second set of gates, and the first and second faces of the quantum dot device may be opposing faces. For example, one or more voltages may be applied through the conductive vias 120-2/122-2 to the gates 106-2/108-2 (part of conductive pathways that extend to the second face 117-2) on a quantum well stack 147 to cause at least one quantum dot 142-2 to form in the quantum well layer 152-2.

At 1026, a quantum state of the first quantum dot may be sensed with the second quantum dot. For example, a quantum state of a quantum dot 142-1 in the quantum well layer 152-1 may be sensed by a quantum dot 142-2 in the quantum well layer 152-2.

Figure 65:
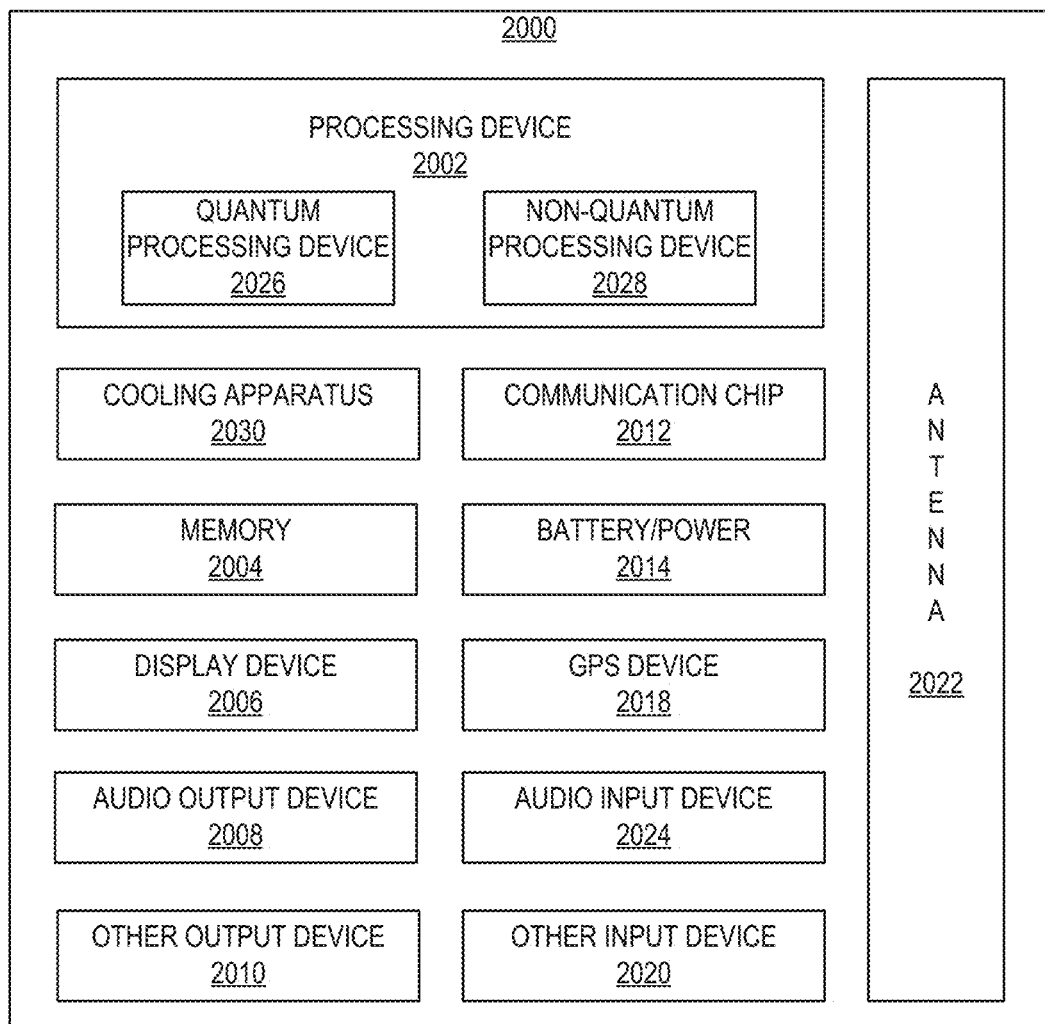
FIG. 65 is a block diagram of an example quantum computing device that may include any of the quantum dot devices disclosed herein, in accordance with various embodiments.

FIG. 65 is a block diagram of an example quantum computing device 2000 that may include any of the quantum dot devices disclosed herein. A number of components are illustrated in FIG. 65 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 65, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Although various ones of the embodiments illustrated in the accompanying drawings may include exactly two quantum well layers 152, this is simply for illustrative purposes, and any of the quantum dot devices 100 (or associated methods or devices) discussed herein may include three or more quantum well layers 152, in accordance with the teachings of the present disclosure. Thus, various ones of the quantum dot devices 100 disclosed herein may be regarded as stacked quantum well structures including two or more quantum well layers 152. For example, a double quantum well structure in a quantum dot device 100 may include two or more quantum well layers 152.

The following paragraphs provide examples of various ones of the embodiments disclosed herein.

Example 1 is a quantum dot device assembly, including: a quantum dot device, including a quantum well stack including first and second quantum well layers, a first set of gates disposed on the quantum well stack such that the first quantum well layer is disposed between the second quantum well layer and the first set of gates, a first set of conductive pathways extending from the first set of gates to a first face of the quantum dot device, a second set of gates disposed on the quantum well stack such that the second quantum well layer is disposed between the first quantum well layer and the second set of gates, and a second set of conductive pathways extending from the second set of gates to a second face of the quantum dot device, wherein the second face is different from the first face.

Example 2 may include the subject matter of Example 1, and may further specify that the second face is opposite to the first face.

Example 3 may include the subject matter of any of Examples 1-2, and may further specify that the first and second faces are first and second faces of a die.

Example 4 may include the subject matter of any of Examples 1-3, and may further specify that the first set of conductive pathways include a tapered via that is narrower closer to the first quantum well layer, and the second set of conductive pathways include a tapered via that is narrower closer to the second quantum well layer.

Example 5 may include the subject matter of any of Examples 1-4, and may further include a circuit board coupled to the first face of the quantum dot device.

Example 6 may include the subject matter of any of Examples 1-5, and may further include: a first electronic component coupled to the first face of the quantum dot device; and a second electronic component coupled to the second face of the quantum dot device.

Example 7 may include the subject matter of Example 6, and may further specify that the first electronic component is in electrical communication with the first set of gates through the first set of conductive pathways.

Example 8 may include the subject matter of Example 7, and may further specify that the second electronic component is in electrical communication with the second set of gates through the second set of conductive pathways.

Example 9 may include the subject matter of any of Examples 6-8, and may further specify that the first and second electronic components are in electrical communication through conductive pathways in the quantum dot device.

Example 10 may include the subject matter of any of Examples 1-9, and may further specify that a first barrier layer is disposed between the first and second quantum well layers, the quantum well stack includes a second barrier layer disposed between the first quantum well layer and the first set of gates, and the quantum well stack includes a third barrier layer disposed between the second quantum well layer and the second set of gates.

Example 11 may include the subject matter of Example 10, and may further specify that the second and third barrier layers include silicon germanium.

Example 12 may include the subject matter of any of Examples 1-11, and may further specify that the first set of conductive pathways has a first arrangement, the second set of conductive pathways has a second arrangement, and the first and second arrangements are mirror images around the quantum well stack.

Example 13 may include the subject matter of any of Examples 1-12, and may further specify that the first and second quantum well layers are formed of silicon or germanium.

Example 14 may include the subject matter of Example 13, and may further specify that a barrier layer is disposed between the first and second quantum well layers, and the barrier layer is formed of silicon germanium.

Example 15 may include the subject matter of any of Examples 1-14, and may further specify that the quantum well stack is included in a first fin, and the quantum dot device further includes a second fin including another quantum well stack.

Example 16 may include the subject matter of Example 15, and may further specify that the quantum dot device further includes third and fourth sets of gates disposed on opposite faces of the second fin.

Example 17 may include the subject matter of any of Examples 1-14, and may further specify that the first set of gates is at least partially disposed in a trench in a first insulating material, and the first set of gates extends over the first insulating material.

Example 18 may include the subject matter of Example 17, and may further specify that the second set of gates is at least partially disposed in a trench in a second insulating material, and the second set of gates extends over the second insulating material.

Example 19 is a method of operating a quantum dot device, including: applying electrical signals through a first set of conductive pathways to a first set of gates disposed proximate to a first face of a quantum well stack to cause a first quantum dot to form in a first quantum well layer in the quantum well stack under the first set of gates; applying electrical signals through a second set of conductive pathways to a second set of gates disposed proximate to a second face of the quantum well stack to cause a second quantum dot to form in a second quantum well layer in the quantum well stack under the second set of gates, wherein the first set of conductive pathways extends between a first face of the quantum dot device and the first set of gates, the second set of conductive pathways extends between a second face of the quantum dot device and the second set of gates, and the first and second faces of the quantum dot device are opposing faces; and sensing a quantum state of the first quantum dot with the second quantum dot.

Example 20 may include the subject matter of Example 19, and may further specify that sensing the quantum state of the first quantum dot with the second quantum dot comprises sensing a spin state of the first quantum dot with the second quantum dot.

Example 21 may include the subject matter of any of Examples 19-20, and may further include: applying the electrical signals to the first set of gates to cause a third quantum dot to form in the first quantum well layer; and prior to sensing the quantum state of the first quantum dot with the second quantum dot, allowing the first and third quantum dots to interact.

Example 22 may include the subject matter of Example 21, and may further specify that allowing the first and third quantum dots to interact includes applying the electrical signals to the first set of gates to control interaction between the first and third quantum dots.

Example 23 may include the subject matter of any of Examples 19-22, and may further include applying the electrical signals to the first set of gates to cause a third quantum dot to form in the first quantum well layer.

Example 24 may include the subject matter of Example 23, and may further include applying the electrical signals to the first set of gates to provide a potential barrier between the first quantum dot and the third quantum dot.

Example 25 is a method of manufacturing a quantum dot device, including: providing a quantum well stack, wherein the quantum well stack includes first and second quantum well layers spaced apart by a barrier layer; forming first gates above a first face of the quantum well stack proximate to the first quantum well layer; forming second gates above a second face of the quantum well stack, wherein the second face of the quantum well stack is opposite to the first face of the quantum well stack and proximate to the second quantum well layer; forming a first set of conductive pathways between the first gates and a first face of the quantum dot device; and forming a second set of conductive pathways between the second gates and a second face of the quantum dot device, wherein the second face of the quantum dot device is different from the first face of the quantum dot device.

Example 26 may include the subject matter of Example 25, and may further specify that providing the quantum well stack includes providing the quantum well stack on a support, and the method further includes, after forming the first gates, separating the first and second quantum well layers from the support.

Example 27 may include the subject matter of Example 26, and may further specify that separating the first and second quantum well layers from the support includes polishing away the support.

Example 28 may include the subject matter of any of Examples 26-27, and may further specify that separating the first and second quantum well layers from the support includes removing at least some of an epitaxial stack that includes the quantum well stack.

Example 29 may include the subject matter of Example 28, and may further specify that removing at least some of the epitaxial stack includes removing at least some buffer material in the epitaxial stack.

Example 30 may include the subject matter of any of Examples 25-29, and may further include: after forming the first gates, doping the quantum well stack proximate to the first quantum well layer; and after forming the second gates, doping the quantum well stack proximate to the second quantum well layer.

Example 31 may include the subject matter of any of Examples 25-30, and may further include, prior to forming the first gates, removing at least some of the quantum well stack to form fins, and providing an insulating material between the fins.

Example 32 may include the subject matter of any of Examples 25-30, and may further include, prior to forming the first gates, providing an insulating material on the quantum well stack, and forming a trench in the insulating material, wherein the trench extends toward the quantum well stack; wherein the first gates are formed at least partially in the trench.

Example 33 is a quantum computing device, including: a quantum processing device, wherein the quantum processing device includes a quantum well stack including an active quantum well layer and a read quantum well layer spaced apart by a barrier layer, first gates to control formation of quantum dots in the active quantum well layer, and second gates to control formation of quantum dots in the read quantum well layer; a non-quantum processing device, coupled to the quantum processing device, to control voltages applied to the first gates through conductive pathways extending from a first face of a die of the quantum processing device to the first gates, and to control voltages applied to the second gates through conductive pathways extending from a second face of the die to the second gates, wherein the first and second faces are different faces; and a memory device to store data generated by the read quantum well layer during operation of the quantum processing device.

Example 34 may include the subject matter of Example 33, and may further include a cooling apparatus to maintain the temperature of the quantum processing device below 5 degrees Kelvin.

Example 35 may include the subject matter of Example 34, and may further specify that the cooling apparatus includes a dilution refrigerator.

Example 36 may include the subject matter of Example 34, and may further specify that the cooling apparatus includes a liquid helium refrigerator.

Example 37 may include the subject matter of any of Examples 33-36, and may further specify that the memory device is to store instructions for a quantum computing algorithm to be executed by the quantum processing device.

Example 38 may include the subject matter of any of Examples 33-37, and may further specify that the barrier layer includes silicon germanium.

Example 39 may include the subject matter of any of Examples 33-38, and may further specify that the first and second faces are opposing faces.

The invention claimed is:

1. A method of manufacturing a quantum dot device, comprising:
    providing a quantum well stack, wherein the quantum well stack includes first and second quantum well layers spaced apart by a barrier layer;
    forming first gates above a first face of the quantum well stack proximate to the first quantum well layer;
    forming second gates above a second face of the quantum well stack, wherein the second face of the quantum well stack is opposite to the first face of the quantum well stack and proximate to the second quantum well layer;
    forming a first set of conductive pathways between the first gates and a first face of the quantum dot device; and
    forming a second set of conductive pathways between the second gates and a second face of the quantum dot device, wherein the second face of the quantum dot device is different from the first face of the quantum dot device.

2. The method of claim 1, wherein providing the quantum well stack includes providing the quantum well stack on a support, and the method further includes:
    after forming the first gates, separating the first and second quantum well layers from the support.

3. The method of claim 1, further comprising:
after forming the first gates, doping the quantum well stack proximate to the first quantum well layer.

4. A quantum dot device assembly, comprising:
a quantum dot device, including:
a quantum well stack including first and second quantum well layers,
a first set of gates on the quantum well stack such that the first quantum well layer is between the second quantum well layer and the first set of gates,
a first set of conductive pathways extending from the first set of gates to a first face of the quantum dot device,
a second set of gates on the quantum well stack such that the second quantum well layer is between the first quantum well layer and the second set of gates, and
a second set of conductive pathways extending from the second set of gates to a second face of the quantum dot device, wherein the second face is different from the first face.

5. The quantum dot device assembly of claim 4, wherein a first barrier layer is between the first and second quantum well layers, the quantum well stack includes a second barrier layer between the first quantum well layer and the first set of gates, and the quantum well stack includes a third barrier layer between the second quantum well layer and the second set of gates.

6. The quantum dot device assembly of claim 4, wherein the first set of conductive pathways include a tapered via that is narrower closer to the first quantum well layer, and the second set of conductive pathways include a tapered via that is narrower closer to the second quantum well layer.

7. The quantum dot device assembly of claim 4, wherein the first set of conductive pathways has a first arrangement, the second set of conductive pathways has a second arrangement, and the first and second arrangements are mirror images around the quantum well stack.

8. The quantum dot device assembly of claim 4, further comprising:
a first electronic component coupled to the first face of the quantum dot device; and
a second electronic component coupled to the second face of the quantum dot device.

9. The quantum dot device assembly of claim 8, wherein the first electronic component is in electrical communication with the first set of gates through the first set of conductive pathways.

10. The quantum dot device assembly of claim 4, wherein the quantum well stack is included in a first fin, and the quantum dot device further includes a second fin including another quantum well stack.

11. The quantum dot device assembly of claim 8, wherein the first and second electronic components are in electrical communication through conductive pathways in the quantum dot device.

12. The quantum dot device assembly of claim 9, wherein the second electronic component is in electrical communication with the second set of gates through the second set of conductive pathways.

13. The quantum dot device assembly of claim 4, further comprising:
a circuit board coupled to the first face of the quantum dot device.

14. The quantum dot device assembly of claim 4, wherein the first and second faces are first and second faces of a die.

15. The quantum dot device assembly of claim 4, wherein the second face is opposite to the first face.

16. The quantum dot device assembly of claim 4, wherein the first set of gates is at least partially in a trench in a first insulating material, and the first set of gates extends over the first insulating material.

17. The quantum dot device assembly of claim 16, wherein the second set of gates is at least partially in a trench in a second insulating material, and the second set of gates extends over the second insulating material.

* * * * *